United States Patent
Guisan et al.

(10) Patent No.: US 11,683,994 B2
(45) Date of Patent: Jun. 20, 2023

(54) MAGNETIC ELEMENT WITH PERPENDICULAR MAGNETIC ANISOTROPY (PMA) AND IMPROVED COERCIVITY FIELD (HC)/SWITCHING CURRENT RATIO

(71) Applicant: Headway Technologies, Inc., Milpitas, CA (US)

(72) Inventors: Santiago Serrano Guisan, San Jose, CA (US); Luc Thomas, San Jose, CA (US); Jodi Mari Iwata, San Carlos, CA (US); Guenole Jan, San Jose, CA (US); Ru-Ying Tong, Los Gatos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 17/582,190

(22) Filed: Jan. 24, 2022

(65) Prior Publication Data

US 2022/0149272 A1    May 12, 2022

Related U.S. Application Data

(62) Division of application No. 16/448,348, filed on Jun. 21, 2019, now Pat. No. 11,264,566.

(51) Int. Cl.
*H10N 50/85* (2023.01)
*H10N 52/01* (2023.01)
(Continued)

(52) U.S. Cl.
CPC ........... *H10N 50/85* (2023.02); *G11C 11/161* (2013.01); *H10N 52/01* (2023.02); *H10N 52/80* (2023.02)

(58) Field of Classification Search
CPC .......... H01L 43/10; H01L 43/08; H01L 43/04; H01L 43/14; H01L 43/12; G11C 11/161; H10N 50/85; H01N 52/01; H01N 52/80
See application file for complete search history.

(56) References Cited

U.S. PATENT DOCUMENTS 4,286,216 A    8/1981    Auld
4,364,012 A    12/1982   Auld
(Continued)

FOREIGN PATENT DOCUMENTS

JP    11337527       12/1999
JP    2005150303     6/2005
(Continued)

OTHER PUBLICATIONS

U.S. Notice of Allowance, U.S. Appl. No. 16/056,783, Applicant: Guisan et al., dated Apr. 22, 2020, 18 pages.
(Continued)

*Primary Examiner* — Omar F Mojaddedi
(74) *Attorney, Agent, or Firm* — Saile Ackerman LLC; Stephen B. Ackerman

(57) ABSTRACT

A perpendicular magnetic tunnel junction is disclosed wherein a metal insertion (MIS) layer is formed within a free layer (FL), a partially oxidized Hk enhancing layer is on the FL, and a nitride capping layer having a buffer layer/nitride layer (NL) is on the Hk enhancing layer to provide an improved coercivity (Hc)/switching current (Jc) ratio for spintronic applications. Magnetoresistive ratio is maintained above 100%, resistance×area (RA) product is below 5 ohm/μm$^2$, and thermal stability to 400° C. is realized. The FL comprises two or more sub-layers, and the MIS layer may be formed within at least one sub-layer or between sub-layers. The buffer layer is used to prevent oxygen diffusion to the NL, and nitrogen diffusion from the NL to the FL. FL thickness is from 11 Angstroms to 25 Angstroms
(Continued)

while MIS layer thickness is preferably from 0.5 Angstroms to 4 Angstroms.

17 Claims, 11 Drawing Sheets

(51) Int. Cl.
| | |
|---|---|
| H10N 52/80 | (2023.01) |
| G11C 11/16 | (2006.01) |
| H01L 27/22 | (2006.01) |
| H01L 43/10 | (2006.01) |
| H01L 43/04 | (2006.01) |
| H01L 43/14 | (2006.01) |
| H01L 43/12 | (2006.01) |

(56) References Cited

U.S. PATENT DOCUMENTS

| | | |
|---|---|---|
| 4,528,506 A | 7/1985 | Davis |
| 5,041,782 A | 8/1991 | Marzan |
| 5,889,402 A | 3/1999 | Kumatoriay |
| 6,166,947 A | 12/2000 | Parkin et al. |
| 6,166,948 A | 12/2000 | Parkin et al. |
| 6,376,836 B1 | 4/2002 | Aniage |
| 6,501,971 B1 | 12/2002 | Wolf |
| 6,544,801 B1 | 4/2003 | Slaughter et al. |
| 6,614,630 B2 | 9/2003 | Horng et al. |
| 6,743,503 B1 | 6/2004 | Chen |
| 6,834,005 B1 | 12/2004 | Parkin |
| 6,847,510 B2 | 1/2005 | Childress et al. |
| 6,974,708 B2 | 12/2005 | Horng et al. |
| 7,183,120 B2 | 2/2007 | Berg et al. |
| 7,335,961 B2 | 2/2008 | Guo et al. |
| 7,417,442 B2 | 8/2008 | Hachisuka et al. |
| 7,486,551 B1 | 2/2009 | Li et al. |
| 7,545,139 B2 | 6/2009 | Saruki et al. |
| 7,576,956 B2 | 8/2009 | Huai |
| 7,586,781 B2 | 9/2009 | Saitoh et al. |
| 7,630,232 B2 * | 12/2009 | Guo .............. H01L 43/08 365/158 |
| 7,635,902 B2 | 12/2009 | Rizzo et al. |
| 7,666,467 B2 | 2/2010 | Parkin |
| 7,742,263 B2 | 6/2010 | Fukumoto et al. |
| 7,817,462 B2 | 10/2010 | Miura et al. |
| 7,863,060 B2 | 1/2011 | Belen et al. |
| 7,902,579 B2 | 3/2011 | Lim et al. |
| 7,936,627 B2 | 5/2011 | Fukami |
| 7,973,351 B2 | 7/2011 | Marukame et al. |
| 8,009,464 B2 | 8/2011 | Kajiyama |
| 8,102,174 B2 | 1/2012 | Worledge et al. |
| 8,264,693 B2 | 9/2012 | Stoica et al. |
| 8,379,429 B2 | 2/2013 | Ishiwata et al. |
| 8,470,462 B2 | 6/2013 | Horng et al. |
| 8,580,583 B2 | 11/2013 | Lee et al. |
| 8,592,927 B2 | 11/2013 | Jan et al. |
| 8,710,603 B2 | 4/2014 | Jan et al. |
| 8,921,961 B2 | 12/2014 | Kula et al. |
| 8,959,980 B2 | 2/2015 | Vodnick et al. |
| 9,006,704 B2 | 4/2015 | Jan et al. |
| 9,030,216 B2 | 5/2015 | Lamson et al. |
| 9,048,411 B2 | 6/2015 | Jan et al. |
| 9,172,032 B2 | 10/2015 | Shen et al. |
| 9,368,551 B2 | 6/2016 | Masuoka et al. |
| 9,425,387 B1 * | 8/2016 | Liu .............. H01L 43/08 |
| 9,614,258 B2 | 4/2017 | Takahashi et al. |
| 9,666,529 B2 | 5/2017 | Huang et al. |
| 9,711,202 B2 | 7/2017 | Kim et al. |
| 9,846,134 B2 | 12/2017 | Yang et al. |
| 9,966,529 B1 | 5/2018 | Iwata et al. |
| 10,014,465 B1 | 7/2018 | Liu |
| 10,128,309 B2 | 11/2018 | Tahmasebi et al. |
| 10,192,600 B2 | 1/2019 | Uchida et al. |
| 10,665,773 B2 | 5/2020 | Iwata et al. |
| 10,754,000 B2 | 8/2020 | Guisan et al. |
| 10,950,782 B2 | 3/2021 | Guisan et al. |
| 11,264,560 B2 | 3/2022 | Iwata et al. |
| 11,264,566 B2 | 3/2022 | Guisan et al. |
| 2003/0184921 A1 | 10/2003 | Sugita et al. |
| 2004/0087037 A1 | 5/2004 | Berg |
| 2004/0100278 A1 | 5/2004 | Haycock |
| 2004/0196037 A1 | 10/2004 | Xiang |
| 2004/0252539 A1 | 12/2004 | Parkin |
| 2007/0253122 A1 | 11/2007 | Fukuzawa et al. |
| 2008/0026253 A1 | 1/2008 | Yuasa |
| 2008/0137405 A1 | 6/2008 | Ohno et al. |
| 2008/0191295 A1 | 8/2008 | Ranjan et al. |
| 2008/0204946 A1 | 8/2008 | Ochiai et al. |
| 2008/0278867 A1 | 11/2008 | Fukumoto et al. |
| 2009/0212769 A1 | 8/2009 | Stoica et al. |
| 2009/0213503 A1 | 8/2009 | Sun et al. |
| 2009/0257151 A1 | 10/2009 | Zhang et al. |
| 2009/0303779 A1 * | 12/2009 | Chen .............. G11C 11/161 365/158 |
| 2010/0020592 A1 * | 1/2010 | Hosotani .............. G11C 11/161 365/158 |
| 2010/0023294 A1 | 1/2010 | Fan et al. |
| 2010/0072524 A1 | 3/2010 | Huai et al. |
| 2010/0090261 A1 | 4/2010 | Zheng et al. |
| 2010/0096716 A1 | 4/2010 | Ranjan et al. |
| 2010/0177449 A1 | 7/2010 | Zhao |
| 2011/0006384 A1 | 1/2011 | Peng et al. |
| 2011/0014500 A1 | 1/2011 | Horng et al. |
| 2011/0032644 A1 | 2/2011 | Watts et al. |
| 2011/0080241 A1 | 4/2011 | Kou |
| 2012/0023386 A1 | 1/2012 | Oh et al. |
| 2012/0025338 A1 | 2/2012 | Ranjan et al. |
| 2012/0068285 A1 | 3/2012 | Kitagawa et al. |
| 2012/0135273 A1 * | 5/2012 | Horng .............. H10N 50/01 428/828.1 |
| 2012/0205758 A1 | 8/2012 | Jan et al. |
| 2012/0280336 A1 | 11/2012 | Jan |
| 2012/0326712 A1 | 12/2012 | Tudosa et al. |
| 2013/0221460 A1 | 8/2013 | Jan |
| 2014/0037990 A1 | 2/2014 | Abraham |
| 2014/0070800 A1 | 3/2014 | Cho et al. |
| 2014/0097841 A1 | 4/2014 | Yang et al. |
| 2014/0291663 A1 | 10/2014 | Kuo |
| 2014/0355152 A1 | 12/2014 | Park et al. |
| 2016/0211442 A1 | 7/2016 | Cao et al. |
| 2016/0284763 A1 | 9/2016 | Tahmasebi et al. |
| 2016/0372212 A1 | 12/2016 | Kishi |
| 2017/0084836 A1 | 3/2017 | Kim et al. |
| 2017/0170391 A1 | 6/2017 | Hu et al. |
| 2017/0338021 A1 | 11/2017 | Xiao |
| 2018/0005746 A1 | 1/2018 | Thomas et al. |
| 2018/0175287 A1 | 6/2018 | Liu |
| 2019/0035447 A1 * | 1/2019 | Zhao .............. H10N 50/10 |
| 2019/0049514 A1 | 2/2019 | O'Brien |
| 2019/0237661 A1 | 8/2019 | Iwata |
| 2020/0006626 A1 | 1/2020 | Smith |

FOREIGN PATENT DOCUMENTS

| | | |
|---|---|---|
| JP | 2007123640 | 5/2007 |
| WO | 2007015474 | 2/2007 |
| WO | 2009101827 | 8/2009 |

OTHER PUBLICATIONS

U.S. Notice of Allowance, U.S. Appl. No. 15/461,779, Applicant: Iwata et al., dated Jan. 17, 2018, 9 pages.

U.S. Notice of Allowance, U.S. Appl. No. 13/068,172, Applicant: Jan et al., dated Jun. 21, 2013, 9 pages.

U.S. Notice of Allowance, U.S. Appl. No. 16/275,381, Applicant: Guisan et al., dated Oct. 30, 2020, 7 pages.

U.S. Notice of Allowance, U.S. Appl. No. 16/448,362, Applicant: Iwata et al., dated Sep. 16, 2021, 17 pages.

U.S. Notice of Allowance, U.S. Appl. No. 16/448,348, Applicant: Guisan et al., dated Aug. 17, 2021, 16 pages.

U.S. Notice of Allowance, U.S. Appl. No. 15/881,035, Applicant: Iwata et al., dated Jan. 15, 2020, 14 pages.

(56) References Cited

OTHER PUBLICATIONS

U.S. Office Action, U.S. Appl. No. 15/881,035, Applicant: Iwata et al., dated Mar. 21, 2019, 17 pages.
U.S. Office Action, U.S. Appl. No. 15/881,035, Applicant: Iwata et al., dated Oct. 4, 2019, 5 pages.
U.S. Office Action, U.S. Appl. No. 16/448,348, Applicant: Guisan et al., dated May 20, 2021, 19 pages.
U.S. Office Action, U.S. Appl. No. 16/448,348, Applicant: Guisan et al., dated Feb. 11, 2021, 29 pages.
U.S. Office Action, U.S. Appl. No. 16/448,362, Applicant: Iwata et al., dated May 20, 2021, 23 pages.
U.S. Office Action, U.S. Appl. No. 16/448,362, Applicant: Iwata et al., dated Feb. 4, 2021, 33 pages.
U.S. Office Action, U.S. Appl. No. 16/275,381, Applicant: Guisan et al., dated Mar. 23, 2020, 16 pages.
U.S. Office Action, U.S. Appl. No. 13/068,172, Applicant: Jan et al., dated Jan. 10, 2013, 12 pages.
U.S. Office Action, U.S. Appl. No. 16/056,783, Applicant: Guisan et al., dated Dec. 19, 2019, 6 pages.
"Current-driven excitation of magnetic multilayers," by J.C. Slonczewski, Journal of Magnetism and Magnetic Materials 159, L-1-L-7, Elsevier, Jun. 1996.
"A perpendicular-anisotropy CoFeB—MgO magnetic tunnel junction," by S. Ikeda et al., Nature materials, Published online: Jul. 11, 2010/ DOI: 10.1038/NMAT2804, www.nature.com/naturematerials, pp. 1-4.
Current-induced domain wall motion in perpendicularly magnetized CoFeB nanowire, by S. Fukami et al., Applied Physics Letters 98, 082504 (2011), Feb. 2011, doi: http://dx.doi.org/10.1063/1.3558917, pp. 1-3.
"Growth, structure, electroic, and magnetic properties of MgO/Fe(001) bilayers and Fe/MgO/Fe(001) trilayers," by M. Klaua et al., Physical Review B, vol. 64, 134411, Sep. 2001, pp. 1-8.

NEC Corp., International Search Report, Application No. PCT/JP2009/050287, dated Apr. 21, 2009, 2 pages.
PCT Search Report, International Application No. PCT/US12/35097, Applicant: MagIC Technologies, Inc., dated Jul. 16, 2012, 13 pages.
"Vector network analyzer ferromagnetic resonance of thin films on coplanar waveguides: Comparison of different evaluation methods," by C. Bilzer et al., AIP Journal of Applied Physics 101, 074505 (2007); Apr. 12, 2007, American Institute of Physics, http://dx.doi.org/10.1063/1.2716995, 5 pgs.
"Open-Circuit One-Port Network Analyzer Ferromagnetic Resonance," by C. Bilzer et al., IEEE Transactions on Magnetics, vol. 44, No. 11, Nov. 2008, pp. 3265-3268.
"Microwave susceptibility of thin ferromagnetic films: metrology and insight into magnetization dynamics," by Claus Bilzer, Jan. 8, 2008, Universite Paris Sud—Paris XI, 2007, Chapter 2.1.1, 2.1.2, 12 pgs.
"An N-Way Hybrid Power Divider," by Ernest J. Wilkinson, IRE Transactions on Microwave Theory and Techniques, vol. 8, Issue: 1, Jan. 1960, pp. 116-118.
"High-temperature thermal stability driven by magnetization dilution in CoFeB free layers for spin-transfer-torque magnetic random access memory," by Jodi M. Iwata-Harms et al., Scientific Reports, vol. 8, Article No. 14409 (2018), Sep. 26, 2018, pp. 1-7.
PCT Search Report, International Application No. PCT/US2013/050190, Applicant: Headway Technologies, Inc., dated Oct. 28, 2013, 10 pages.
PCT Search Report, International Application No. PCT/US12/70321, Applicant: Headway Technologies, Inc., dated Mar. 4, 2013, 12 pages.
International Search Report, PCT/JP 2009/050287, Applicant: NEC Corp, dated Apr. 21, 2009.

\* cited by examiner

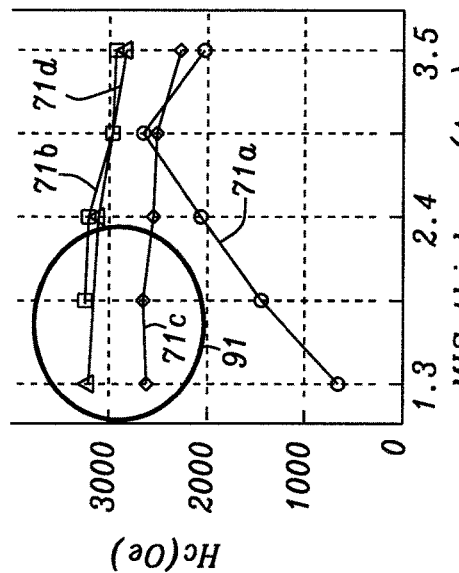
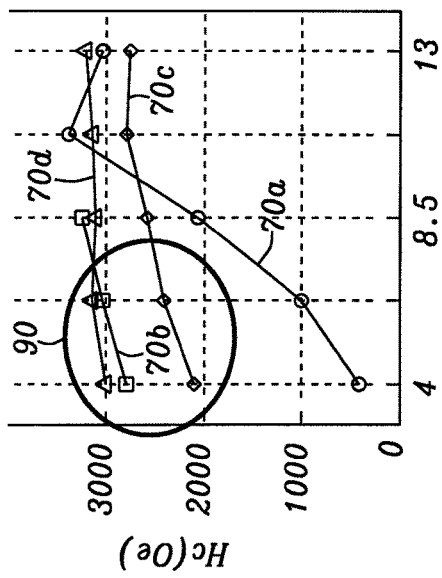
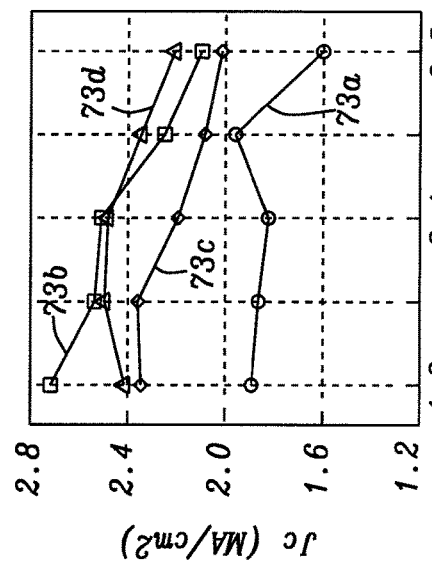
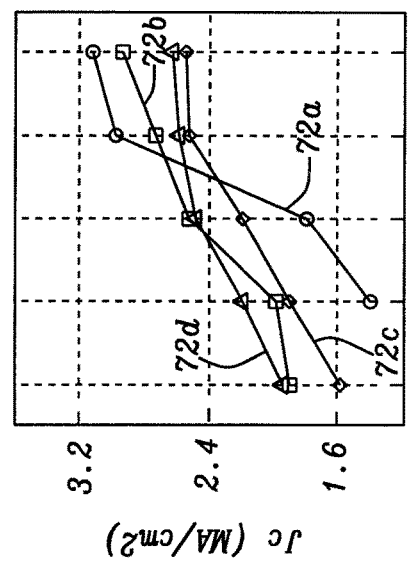
FIG. 9A
FIG. 9B
FIG. 10A
FIG. 10B

MAGNETIC ELEMENT WITH PERPENDICULAR MAGNETIC ANISOTROPY (PMA) AND IMPROVED COERCIVITY FIELD (HC)/SWITCHING CURRENT RATIO

This is a divisional application of U.S. patent application Ser. No. 16/448,348; filed on Jun. 21, 2019, which is herein incorporated by reference in its entirety, and assigned to a common assignee.

RELATED PATENT APPLICATIONS

This application is related to the following: U.S. Pat. Nos. 8,592,927; 9,966,529; 10,665,773; 10,754,000; 10,950,782; Ser. No. 16/448,362, filed Jun. 21, 2019; which are assigned to a common assignee and herein incorporated by reference in their entirety.

TECHNICAL FIELD

The present disclosure relates to a perpendicular magnetic tunnel junction (p-MTJ) comprised of a partially oxidized Hk enhancing layer, a nitride capping layer (NCL), and a free layer (FL) that interfaces with a tunnel barrier layer and the Hk enhancing layer where Hk is the FL anisotropy field, and wherein the FL has a metal insertion (MIS) layer for reducing the FL magnetization×saturation (Ms) value, reducing oxygen diffusion through the FL, and serving as a B sink thereby enabling the p-MTJ to have lower Hc/switching current ratio than existing designs while maintaining acceptable thermal stability, a magnetoresistive ratio above 100%, and a resistance×area (RA) product below 5 ohm-μm² required for spintronic applications including advanced spin-transfer torque (STT)-magnetoresistive random access memory (MRAM) devices.

BACKGROUND

MRAM that is based on the integration of silicon CMOS (complementary metal on semiconductor) with magnetic tunnel junction (MTJ) technology, is a major emerging technology that is highly competitive with existing semiconductor memories such as SRAM, DRAM, and Flash. Furthermore, spin-transfer torque (STT) magnetization switching described by J. Slonczewski in "Current driven excitation of magnetic multilayers", J. Magn. Magn. Mater. V 159, L1-L7 (1996), has stimulated considerable interest due to its potential application for spintronic devices such as STT-MRAM on a gigabit scale.

STT-MRAM is based on a p-MTJ element having a tunneling magneto-resistance (TMR) effect and wherein a stack of layers has a configuration in which two ferromagnetic (FM) layers are separated by a thin non-magnetic dielectric layer. One of the FM layers called the pinned layer (PL) has a magnetic moment that is pinned in a first direction while the other FM layer known as the free layer (FL) has a magnetic moment that is free to rotate in a direction parallel or anti-parallel to the first direction. Compared with conventional MRAM, STT-MRAM has an advantage in avoiding the half select problem associated with external magnetic fields generated by current carrying lines, and writing disturbance between adjacent cells. Magnetoresistive ratio (MR), also referred to as DRR, is equal to $R_{AP}-R_P/R_P$ where $R_P$ and $R_{AP}$ are the resistance for the aforementioned parallel (P) and anti-parallel (AP) states, respectively. It is important to have a MR above 1 (also expressed as 100%) since the MR is directly related to the read margin for the memory bit, or how easy it is to differentiate between the P state and AP state (0 or 1 bits).

The spin-transfer effect in STT-MRAM arises from the spin dependent electron transport properties of PL-spacer-FL multilayers. When a spin-polarized current traverses a magnetic multilayer in a current perpendicular to plane (CPP) direction, the spin angular moment of electrons incident on a FL interact with the magnetic moment of the FL near the interface between the FL and non-magnetic spacer that is typically a tunnel barrier layer. Through this interaction, the electrons transfer a portion of their angular momentum to the FL. As a result, spin-polarized current can switch the magnetization direction of the FL if the current density is sufficiently high, and if the dimensions of the multilayer are small.

Thermal requirements and low voltage switching in the dynamic regime are significant challenges for STT-MRAM in last level cache (LLC) applications. STT-MRAM is enabled by perpendicular magnetic anisotropy (PMA) MTJs (also called p-MTJs) that rely on interfacial perpendicular anisotropy produced at metal oxide/FL interfaces that are usually MgO/CoFeB or the like. To satisfy maximum process temperatures of 400° C. during a plurality of hours, it is essential that p-MTJs exhibit high thermal stability. Typically, thermal stability is improved by incorporating a second metal oxide/FL interface to enhance PMA within the FL. The second metal oxide is called a Hk enhancing layer and contributes to the total resistance×area (RA) product for the device. $RA_{TOTAL}=RA_{barrier} RA_{Hk}$ where $RA_{barrier}$ is the RA product contribution from the tunnel barrier and $RA_{Hk}$ is the RA product contribution from the Hk enhancing layer. Also, DRR is decreased somewhat according to the following equations (1) and (2) where $R_P^{Hk}$ is the parasitic resistance arising from the Hk enhancing layer.

$$DRR = \frac{R_{AP} - R_P}{R_P} \text{ where } R_{AP} = R_{AP}^{barrier} + R_{AP}^{Hk} \text{ and } R_P = R_P^{barrier} + R_P^{Hk} \qquad \text{Eq. (1)}$$

Since $R_{AP}^{Hk} = R_P^{Hk}$ $$DRR = \frac{R_{AP}^{barrier} + R_{AP}^{Hk} - (R_P^{barrier} + R_P^{Hk})}{R_P^{barrier} + R_P^{Hk}} = \frac{R_{AP}^{barrier} - R_P^{barrier}}{R_P^{barrier} + R_P^{Hk}} \qquad \text{Eq. (2)}$$

Low switching voltages below 500 mV are equally important for the mass production of STT-MRAM for LLC applications operating in a precessional regime requiring reversal of FL magnetization at short pulse lengths below 10 ns, and at deep error rates of about 99.9%. There are two approaches for achieving low switching voltage. One method is to reduce the $RA_{TOTAL}$ for a p-MTJ by preventing oxygen deficiency in the tunnel barrier and Hk enhancing layer thereby reducing $RA_{barrier}$ and $RA_{Hk}$, respectively, and involves thinning the metal oxide layers. However, this pathway becomes impractical in view of the difficulty in ensuring full oxidation of the metal oxide layer without oxidizing one or both of the FL and PL.

Another approach to improving switching efficiency is to reduce FL thickness. However, a low $RA_{barrier}$ and $RA_{Hk}$ usually means there are a substantial number of oxygen vacancies in the metal oxide matrix that reduce the MgO bonding energy and increase interlayer oxygen diffusion, and intra-layer diffusion of oxygen to adjacent layers. This effect is enhanced as FL thickness decreases. Accordingly, there is a significant challenge to fabricate p-MTJs with high PMA and Hc, and low switching current (Jc). Thus, an improved FL/Hk enhancing layer/capping layer structure is essential for achieving low switching current without compromising Hc. Nitride capping layers (NCLs) have been used, but tend to introduce a new concern regarding nitrogen diffusion to the Hk enhancing layer and FL. Furthermore, there may be oxygen diffusion into a NCL that introduces a new RA product called $RA_{NCL}$ into $RA_{TOTAL}$.

Metal insertion within the FL is known to play an important role in gettering elements including C, N, and O within the FL and the formation of carbides, nitrides, and oxides, respectively. The low atomic number (Z) elements are typically introduced into the FL during oxidation of the Hk enhancing layer, nitridation of the capping layer, and during FL sputter deposition due to oxygen content in the target, and their diffusion through the p-MTJ is exacerbated during high temperature processing up to 400° C. Gettering of the low Z elements preserves the quality of the CoFeB free layer and the FL interfaces with the adjoining metal oxide layers.

A new p-MTJ structure is needed that is compatible with a nitride capping layer and has a FL/Hk enhancing layer stack that preserves the integrity of the FL, provides for lower switching current (lower Hc/Jc ratio), and maintains other critical p-MTJ properties including DRR of at least 100%, RA product<5 ohm-$\mu m^2$, and thermal stability to 400° C.

SUMMARY

One objective of the present disclosure is to provide a p-MTJ with a FL/Hk enhancing layer/NCL stack having sufficient Hc and Hk to provide thermal stability to 400° C. for a plurality of hours while enabling the p-MTJ to realize an improved Hc/Jc ratio over existing designs.

A second objective is to provide the p-MTJ according to the first objective that also has a DRR of at least 100%, and a resistance×area (RA) product<5 ohm-According to one embodiment, these objectives are achieved by providing a p-MTJ comprised of a reference layer, tunnel barrier layer, and a FL with a first surface that interfaces with a first oxide layer (tunnel barrier layer), and a second surface that interfaces with a second oxide layer which is referred to as a Hk enhancing layer. A nitride capping layer (NCL) is the uppermost layer in the p-MTJ. FL regions proximate to the interfaces with the oxide layers exhibit substantial interfacial perpendicular anisotropy that enhance PMA in the FL.

A key feature is that the FL comprises a metal insertion (MIS) layer that may be in the form of a multilayer stack, a continuous layer, a discontinuous layer, or a dispersion of clusters or particles within the FL. The MIS layer is advantageously employed to reduce FL Ms, getter oxygen that diffuses from the tunnel barrier and Hk enhancing layer, and in some cases serves as a B sink to enhance DRR. Preservation of an amorphous CoFeB FL enables a higher quality FL due to delayed recrystallization at elevated process temperatures. The MIS layer is comprised of one or more of Nb, Mo, Ta, W, Re, Ti, V, Cr, Zr, Hf, Ru, Rh, Os, Ir, Cu, Zn, Pt, Au, Ag, Pd, Al, B, Ga, Si, and Ge, and preferably has a thickness from about 0.5 Angstrom to 4 Angstroms.

Another key feature is optimization of the Hk enhancing layer/NCL stack to minimize the $RA_{NCL}$ contribution to $RA_{TOTAL}$ for the p-MTJ. Preferably, the Hk enhancing layer is partially oxidized (non-stoichiometric oxidation condition), and the NCL has a lower layer that substantially blocks oxygen diffusion from the Hk enhancing layer into the upper nitride layer (NL). In other embodiments, the NCL also has a middle layer to prevent nitrogen diffusion from the NL to the FL. The NL is a metal nitride (M1N) or metal oxynitride (M1ON) where M1 is a metal or alloy that is one or more of Ti, V, Cr, Zr, Nb, Mo, Hf, Ta, W, and Mg. In an alternative embodiment, the NL has a M2M3N or M2M3ON composition where M2 is one of B, Al, Si, Ga, In, and Tl, and M3 is one or more of Pt, Au, Ag, Mg, Ca, Sr, Ba, Sc, Y, La, Co, Fe, Mn, Ru, Rh, Ir, Ni, Pd, Zn, Cu, Ti, V, Cr, Zr, Nb, Mo, Hf, Ta, and W such that the NL is a conductive alloy layer, or has M3 conductive channels formed in a M2N or M2ON insulating matrix.

According to a first embodiment, the FL has a stack with a FL1/MIS/FL2 configuration wherein the first FL sub-layer (FL1) contacts the tunnel barrier, and the second FL sub-layer (FL2) adjoins the Hk enhancing layer. FL1 has a thickness t1 and FL2 has a thickness t2 where (t1+t2) is preferably from 11 Angstroms to 25 Angstroms in order to guarantee the FL has sufficient PMA to enable a switching current applied perpendicular to the planes of the p-MTJ layers to flip the FL. The p-MTJ may have a bottom spin valve, top spin valve, or dual spin valve structure. Each of FL1 and FL2 is a single layer or multilayer of one or more of Co, Fe, CoFe, CoFeB, CoB, FeB, CoFeNi, or CoFeNiB. Optionally, one or both of FL1 and FL2 is a Heusler alloy including $Ni_2MnZ$, $Pd_2MnZ$, $Co_2MnZ$, $Fe_2MnZ$, $Co_2FeZ$, $Mn_3Ge$, $Mn_2Ga$, and the like where Z is one of Si, Ge, Al, Ga, In, Sn, and Sb. In other embodiments, one or both of FL1 and FL2 is an ordered $L1_0$ or $L1_1$ material such as MnAl, MnGa, and RT wherein R is Rh, Pd, Pt, Ir, or an alloy thereof, and T is Fe, Co, Ni or an alloy thereof. In yet another embodiment, one or both of FL1 and FL2 is a rare-earth alloy including but not limited to TbFeCo, GdCoFe, FeNdB, and SmCo.

In a second embodiment, the p-MTJ has a FL1a/MIS/FL1b/FL2 configuration where the MIS layer is formed between first and second FL1 sub-layers called FL1a and FL1b, respectively. According to a third embodiment, the MIS layer is within FL2 to give a p-MTJ having a FL1/FL2a/MIS/FL2b configuration where FL2a and FL2b are first and second FL2 sub-layers, respectively.

The present disclosure also anticipates a fourth embodiment where a first MIS (MIS1) layer is formed within FL1, and a second MIS (MIS2) layer is formed within FL2 to provide a FL1a/MIS1/FL1b/FL2a/MIS2/FL2b configuration with more flexibility in adjusting FL magnetic performance.

BRIEF DESCRIPTION OF THE DRAWINGS

FIG. 9A and FIG. 9B show a plot of Hc vs. FL2 thickness and Hc vs. MIS thickness, respectively, for p-MTJs having a metal capping layer, a NCL, and two different iNCLs.

FIG. 10A and FIG. 10B show a plot of Jc vs. FL2 thickness and Jc vs. MIS thickness, respectively, for the p-MTJs with different capping layers in FIG. 9A and FIG. 9B, respectively.

DETAILED DESCRIPTION

Figure 1A:
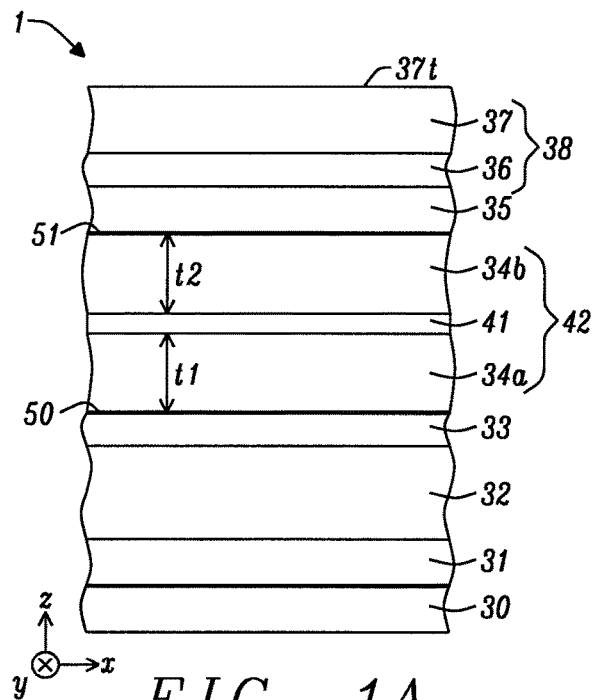
FIG. 1A and FIG. 1B are cross-sectional views showing a p-MTJ wherein a metal insertion (MIS) layer is formed between a first free layer (FL1) and a second free layer (FL2) in bottom spin valve (bsv) and top spin valve (tsv) configurations, respectively, according to a first embodiment of the present disclosure.

The present disclosure is a p-MTJ wherein a MIS layer is formed within a free layer, and the overlying Hk enhancing layer/NCL stack is optimized to provide a lower Hc/Jc ratio than the prior art while maintaining a DRR of at least 100%, a RA <5 ohm-$\mu m^2$, and acceptable thermal stability to 400° C. for a plurality of hours in a STT-MRAM for LLC applications. Although the exemplary embodiments depict p-MTJ stacks with bottom spin valve and top spin valve configurations, the present disclosure also encompasses a p-MTJ having a dual spin valve structure as appreciated by those skilled in the art. The p-MTJ may be incorporated in a MRAM, STT-MRAM, spin orbit torque (SOT)-MRAM, and other spintronic devices such as a spin torque oscillator, Spin Hall Effect device, magnetic sensor, or a biosensor. The p-MTJ layers in the drawings are not necessary drawn to size. In particular, the FL may appear thicker than the pinned layer in order to clearly show multiple FL sub-layers. The term "partially oxidized" when referring to a metal oxide layer means that the metal oxide lattice has a plurality of vacant sites between metal atoms that are not occupied by oxygen atoms. In other words, partial oxidation of a metal layer leads to a non-stoichiometric oxidation state where a plurality of metal atoms is not oxidized.

Previously, we have disclosed various methods of improving magnetic properties in a p-MTJ that involve optimization of one or more of the FL, Hk enhancing layer, and NCL. In related U.S. Pat. No. 8,592,927, one or more elements including Mg and Ta are inserted as a MIS layer between FL1 and FL2 to reduce the perpendicular demagnetizing field thereby lowering the RA product and yielding higher thermal stability. Related U.S. Pat. No. 9,966,529 discloses that formation of metal oxide clusters or a discontinuous metal oxide layer within the FL is advantageous in enhancing PMA and thermal stability while maintaining RA at an acceptable level. Related U.S. Pat. Nos. 10,665,773 and 10,950,782 describe an improved NCL having a buffer layer/NL stack, and an L2/L1/NL stack, respectively, where L2 blocks oxygen diffusion from the adjoining Hk enhancing layer that has a RA product less than that of the tunnel barrier, and L1 prevents nitrogen diffusion from the NL to the FL.

Now we have discovered a further improvement in p-MTJ performance where a combination of a MIS layer in the FL, a Hk enhancing layer with a non-stoichiometric oxidation state, and a NCL enables a lower Hc/Jc ratio than previously achieved while maintaining acceptable properties for DRR, RA product, and thermal stability. Improved p-MTJ performance is realized by including at least one MIS layer within a FL stack having a FL1/FL2 configuration. It should be understood that the present disclosure also encompasses other embodiments, (not shown) where the FL has three or more layers as in a FL1/FL2/FL3 stack, for example, and at least one of FL1, FL2, and FL3 contains the MIS layer, or the at least one MIS layer is formed between two of FL1, FL2, and FL3. In all embodiments described herein, the FL has a thickness ≥11 Angstroms in order to guarantee sufficient PMA so that a switching current applied perpendicular to the planes of the p-MTJ is able to switch the FL magnetization direction. The present disclosure anticipates that the MIS layer is sufficiently thin, and preferably between 0.5 Angstrom and 4 Angstroms, to avoid a significant decrease in DRR.

Referring to FIG. 1A, a first embodiment of the present disclosure is depicted where a p-MTJ 1 is formed on a substrate 30 that is a bottom electrode, for example, and has a stack of layers wherein an optional seed layer 31, pinned layer 32, tunnel barrier layer 33, FL 42, Hk enhancing layer 35, and a capping layer 38 are sequentially formed on the substrate. One key feature is the FL is a stack wherein a first FL sub-layer (FL1) 34a, MIS layer 41, and a second FL sub-layer (FL2) 34b are sequentially formed on the tunnel barrier layer. Thus, FL1 forms a first interface 50 with the tunnel barrier layer while FL2 has a second interface 51 with the Hk enhancing layer so that PMA within FL1 and FL2, respectively, is enhanced.

Seed layer 31 is typically a single layer or multilayer made of one or more metals or alloys that promote a uniform thickness in overlying layers. When the reference layer 32 has PMA, a seed layer is chosen that also enhances PMA in the reference layer. In some embodiments, the reference layer is a single magnetic layer that is one or more of Co and Fe that may be alloyed with one or both of B and Ni. Alternatively, the reference layer may have a synthetic antiferromagnetic (SyAF) configuration represented by AP2/coupling layer/AP1 where AP2 is a first magnetic layer on the seed layer, or formed on an optional antiferromagnetic (AFM) layer (not shown), and AP1 is a second magnetic layer that is antiferromagnetically (AF) coupled to AP2 through a metal coupling layer that is Ru or the like. In other embodiments, the reference layer, or one or both of AP2 and AP1 in a SyAF configuration is a laminated stack of layers such as $(Co/Ni)_n$, $(CoFe/Ni)_n$, $(CoFe/NiCo)_n$, $(CoFe/NiFe)_n$, or the like having inherent PMA and where n is an integer representing the lamination number. There may be a transition layer (not shown) that is one of Co, Fe, CoFe, and CoFeB between the uppermost layer in the laminated stack and the tunnel barrier layer 33.

In a preferred embodiment, tunnel barrier layer 33 is MgO that is formed by sputter depositing a MgO target, or by depositing one or more Mg layers and then oxidizing one or more Mg layers with a known radical oxidation (ROX) or natural oxidation (NOX) method. However, other metal oxides, metal nitrides, or metal oxynitrides known in the art may be employed instead of MgO. It should be understood that the interface of a MgO layer with a magnetic layer that is CoFeB, for example, provides higher interfacial perpendicular anisotropy and a greater magnitude of PMA in the magnetic layer than an interface with other metal oxides.

One or both of FL1 34a and FL2 34b is a single layer or multilayer of one or more of Co, Fe, CoFe, CoFeB, CoB, FeB, CoFeNi, or CoFeNiB. Optionally, one or both of FL1 and FL2 is a Heusler alloy including $Ni_2MnZ$, $Pd_2MnZ$, $Co_2MnZ$, $Fe_2MnZ$, $Co_2FeZ$, $Mn_3Ge$, $Mn_2Ga$, and the like where Z is one of Si, Ge, Al, Ga, In, Sn, and Sb. In other embodiments, one or both of FL1 and FL2 is an ordered $L1_0$ or $L1_1$ material such as MnAl, MnGa, and RT wherein R is Rh, Pd, Pt, Ir, or an alloy thereof, and T is Fe, Co, Ni or an alloy thereof. In yet another embodiment, one or both of FL1 and FL2 is a rare-earth alloy including but not limited to TbFeCo, GdCoFe, FeNdB, and SmCo. FL1 has a thickness t1, and FL2 has a thickness t2 where (t1+t2) is preferably from 11 Angstroms to 25 Angstroms.

The MIS layer 41 is one or more of Nb, Mo, Ta, W, Re, Ti, V, Cr, Zr, Hf, Ru, Rh, Os, Ir, Cu, Zn, Pt, Au, Ag, Pd, Al, B, Ga, Si, and Ge, and preferably has a thickness from 0.5 Angstrom to 4 Angstroms. FL1 34a, the MIS layer, and FL2 34b are typically sputter deposited in succession. The MIS layer is relied upon to reduce Ms in the FL, and getter oxygen that diffuses into one or both of FL1 and FL2 from the tunnel barrier layer 33 and from the Hk enhancing layer 35. It is believed that at least a portion of the MIS layer reacts with diffused oxygen to form a metal oxide that introduces additional FL/metal oxide interfaces to further enhance PMA. Moreover, the MIS layer serves as a boron sink by attracting boron thereby enabling a CoFeB FL, for example, to crystallize in the required (001) body centered cubic orientation for optimum magnetic properties.

The Hk enhancing layer 35 is made of a material that provides interfacial perpendicular anisotropy at interface 51 by contacting a surface of the free layer. According to one preferred embodiment, the Hk enhancing layer is comprised of MgO having a thickness and oxidation state that are controlled to give a resistance×area (RA) product smaller than that of the MgO layer in the tunnel barrier layer 33 in order to minimize a total RA ($RA_{TOTAL}$) for the p-MTJ, and avoid a significant decrease in the DRR because of the parasitic resistance effect previously mentioned with regard to equation (2). In an alternative embodiment, the Hk enhancing layer may be an oxide or oxynitride comprised of one or more of Si, Sr, Ti, Ba, Ca, La, Al, Mn, V, and Hf. Moreover, the Hk enhancing layer may be embedded with conductive particles made of one or more of Fe, Co, Ni, Ru, Cr, Au, Ag, and Cu to lower the resistivity therein. For instance, the conductive particles may be 20% to 45% by weight of the Hk enhancing layer.

The Hk enhancing layer is formed by first depositing one or more of the aforementioned metals on the FL, and then performing a well known natural oxidation (NOX) or oxynitridation process. The Hk enhancing layer preferably has a non-stoichiometric oxygen content where a substantial number of sites in the metal lattice remain vacant (unoccupied by oxygen atoms) or are filled with other atoms such as N in order to minimize the $RA_{HK}$ contribution to $RA_{TOTAL}$ for p-MTJ 1 in the equation $RA_{TOTAL}=RA_{barrier}\ RA_{Hk}\ RA_{NCL}$ where $RA_{barrier}\ RA_{Hk}\ RA_{NCL}$ are the RA products for the tunnel barrier layer 33, Hk enhancing layer 35, and NCL 38, respectively. Preferably, $RA_{TOTAL}$ is <5 ohm-$\mu m^2$. The extent of oxidation during the NOX process is usually controlled with one or both of the oxygen flow rate and the duration of the oxygen flow within an oxidation chamber.

The uppermost layer in p-MTJ 1 is NCL 38 with a thickness from 4 Angstroms to 500 Angstroms, and in one preferred embodiment has a lower buffer layer 36 and an upper NL 37 where the buffer layer is relied on to block oxygen diffusion from the Hk enhancing layer to the NL, and to prevent nitrogen diffusion from the NL to the Hk enhancing layer 35 and FL 42. In one preferred embodiment, the buffer layer is a single layer or multilayer that is one or more of Mo, W, Ru, Nb, Ta, Cr, Pt, Cu, Au, Ag, Zn, V, Cd, Sn, Ir, Mn, Rh, Co, Fe, CoFe, CoB, FeB, CoFeNi, and CoFeNiB. In some embodiments, the buffer layer has a bilayer stack L2/L1 (not shown) where L2 is formed on the Hk enhancing layer and is responsible for blocking oxygen diffusion, and L1 adjoins a bottom surface of the NL and prevents nitrogen diffusion, and L2 is less easily oxidized than L1. L1 and L2 compositions are described in more detail in related U.S. Pat. No. 10,950,782.

NL 37 is comprised of a metal or alloy (M1) where M1 is preferably one or more of Ti, Zr, Hf, V, Nb, Ta, Cr, Mo, Mg, and W to afford a conductive nitride (M1N) or oxynitride (M1ON) to minimize the $RA_{NCL}$ contribution to $RA_{TOTAL}$. In other embodiments, the NL is an insulating metal (M2) nitride or oxynitride where M2 is one of B, Al, Si, Ga, In, or TI that is alloyed with a conductive metal or alloy (M3) selected from one or more of Pt, Au, Ag, Mg, Ca, Sr, Ba, Sc, Y, La, Co, Fe, Mn, Ru, Rh, Ir, Ni, Pd, Zn, Cu, Ti, V, Cr, Zr, Nb, Mo, Hf, Ta, and W to impart conductivity to the resulting M2M3 nitride (M2M3N), or M2M3 oxynitride (M2M3ON). The M2M3N or M2M3ON layers may be formed by sputter depositing M2 and M3 targets in reaction chamber with a plasma generated using a flow of $N_2$ and RIE conditions, or by sputtering a M2M3 alloy, if available, in the presence of nitrogen plasma. The present disclosure also encompasses an embodiment where M3 forms conductive channels in an insulator M2N or M2ON matrix.

We find that a NCL has improved performance over a metal capping layer (MCL) such as Ta/Ru in terms of providing higher thermal stability to the p-MTJ, and enabling a higher Hc/Jc ratio. As indicated later, Hc in a p-MTJ with a MCL is dramatically lower than for p-MTJ 1 with NCL 38 because Hc is significantly lower at a given Jc when FL thickness approaches 11 Angstroms for a p-MTJ with an uppermost MCL. On the other hand, we observe that $RA_{NCL}$ is up to 1.5 times larger than $RA_{MCL}$. Therefore, optimization of the Hk enhancing layer is necessary to maintain $RA_{TOTAL}$<5 ohm-$\mu m^2$ for p-MTJ 1 so that there are no trade-offs when achieving the advantage of a substantially larger Hc/Jc than in the prior art.

Magnetic properties including Hk, Hc, RA, and DRR that are reported herein were obtained with ferromagnetic resonance measurements as disclosed in related U.S. Pat. No. 10,754,000, and with Vibrating Sample Magnetometry (VSM) and current-in-plane tunneling (CIPT) measurements.

Figure 5B:
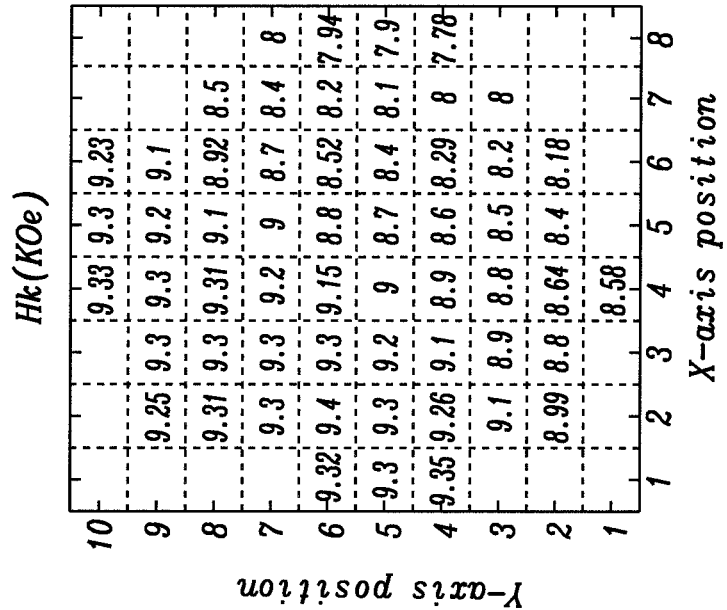
FIG. 5B is a plot of Hk as a function of x-axis and y-axis positions on a STT-MRAM wafer for a p-MTJ stack comprised of a FL/Hk enhancing layer/nitride capping layer (NCL) stack known to the inventors.
Figure 5A:
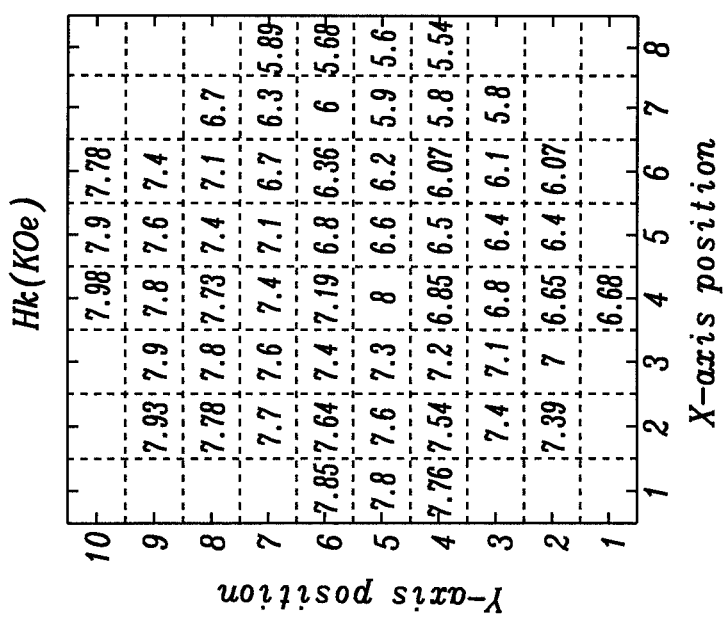
FIG. 5A is a plot of Hk as a function of x-axis and y-axis positions on a STT-MRAM wafer for a p-MTJ stack comprised of a FL/Hk enhancing layer/metal capping layer (MCL) stack of the prior art.

Referring to FIG. 5A and FIG. 5B, a comparison of Hk at various x-axis and y-axis positions on a STT-MRAM wafer is depicted for a p-MTJ with a MCL and NCL, respectively, formed on a stack of layers having a seed layer/PL/tunnel barrier/FL/Hk enhancing layer according to FIG. 1A except that FIG. 5A data is based on a p-MTJ where the NCL 38 in FIG. 1A is replaced with a MCL (not shown). The wafers were annealed at 400° C. for 220 minutes. The results show substantially higher Hk when a NCL (M1/M1N configuration) is used as the capping layer in p-MTJ 1 compared with a p-MTJ where a MCL (Mo/Ru/Ta) is the uppermost layer.

Figure 6:
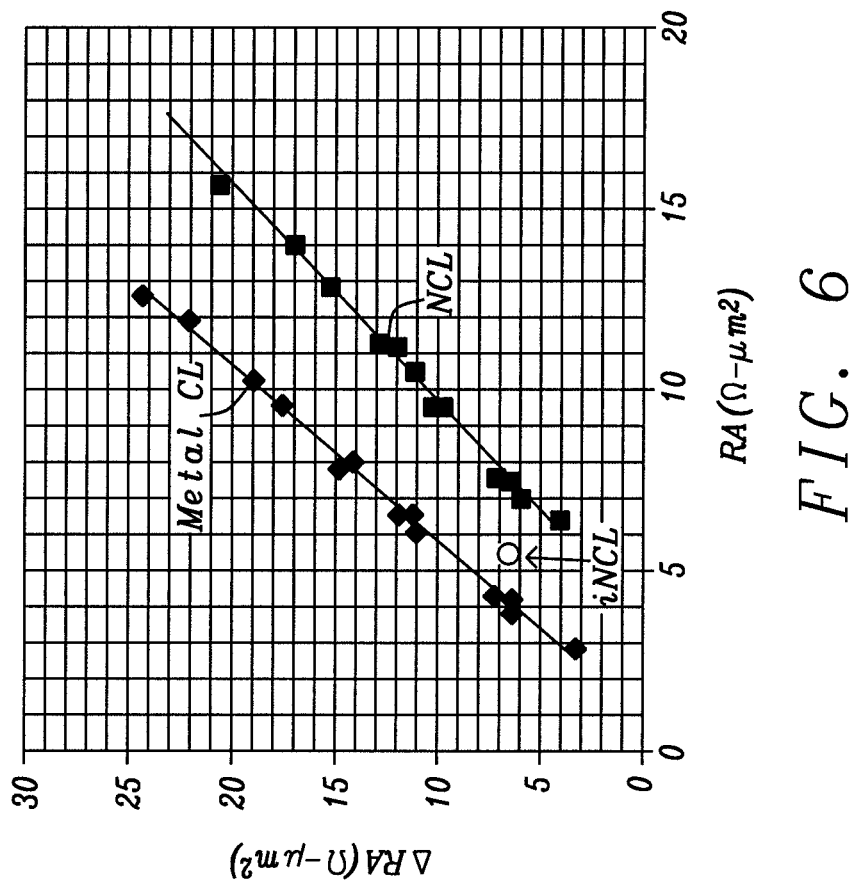
FIG. 6 is a plot of delta RA vs. RA for p-MTJs comprised of the FL/Hk enhancing layer/MCL stack of FIG. 5A, the FL/Hk enhancing layer/NCL stack of FIG. 5B, and an improved FL/Hk enhancing layer/NCL stack referred to as iNCL according to an embodiment of the present disclosure.

In FIG. 6, ARA is plotted vs. RA for the STT-MRAM wafers in FIGS. 5A-5B. The p-MTJs with the NCL have a RA about 1.5 times larger than when a MCL is used. Although the actual mechanism that causes $RA_{NCL}$ to be 1.5× that of $RA_{MCL}$ is unknown, it is possible that a single buffer layer 36 does not completely suppress oxygen diffusion to the NCL such that the NCL 37 may be partially oxidized to increase the RA product. FIG. 6 also indicates that when an improved Hk enhancing layer is used in the p-MTJ stack with the iNCL designation explained previously, the lower oxidation state in the Hk enhancing layer 35 causes a reduced value for $RA_{iCNL}$ compared with $RA_{NCL}$.

Figures 7A, 7B:
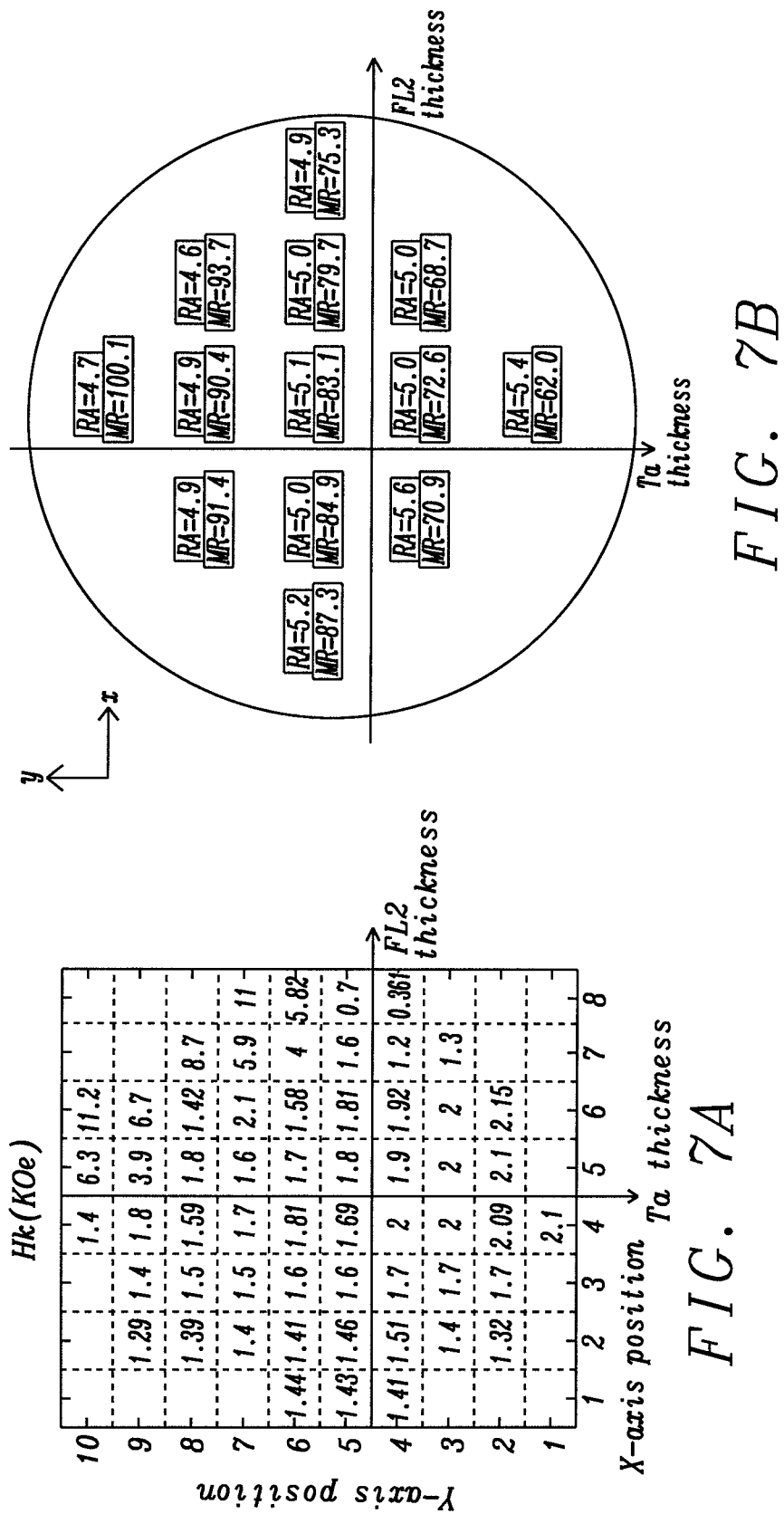
FIG. 7A is a plot of Hk for a STT-MRAM wafer having a plurality of p-MTJs with an FL1/MIS/FL2/improved Hk enhancing layer/NCL stack, and where FL2 thickness is varied in the x-axis direction, and the MIS layer is Ta with a thickness that is varied in the y-axis direction.
FIG. 7B is a view of a STT-MRAM wafer where RA product and MR for p-MTJs in FIG. 7A are plotted as a function of FL2 thickness and Ta MIS layer thickness.
Figure 7C:
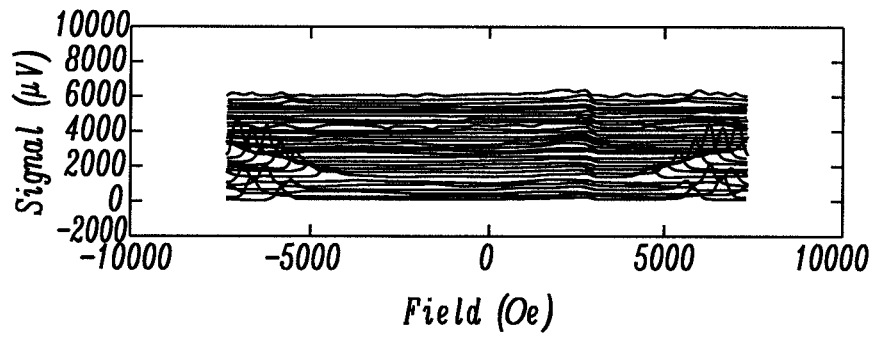
FIG. 7C is a graph showing FMR signals as a function of applied magnetic field (Hr) for the STT-MRAM wafer in FIG. 7A wherein the FMR signals are used to determine magnetic properties such as Hk.
Figure 7D:
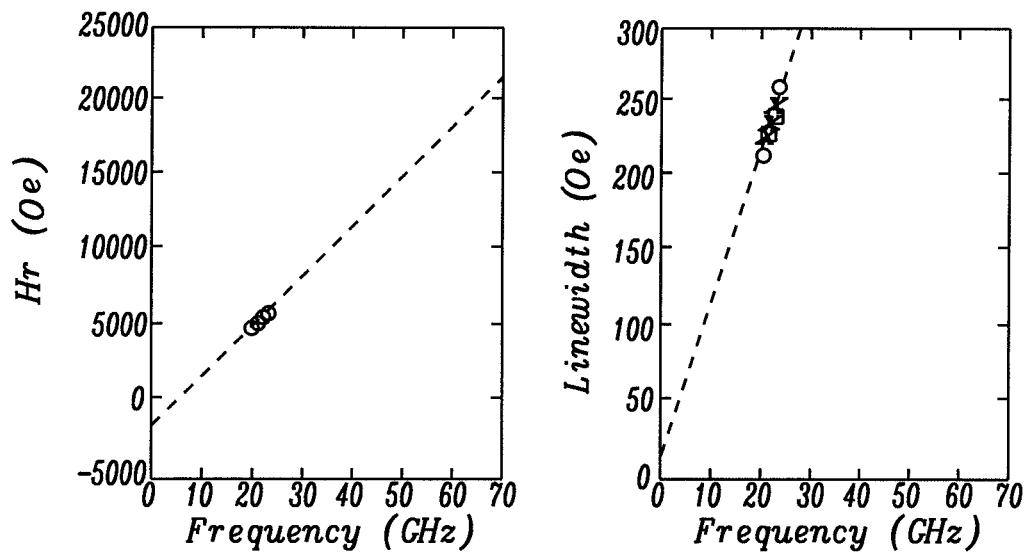
FIG. 7D is a graph showing the dependence of Hr and FMR linewidth on Ta and FL2 thicknesses for p-MTJs within the circled region on the wafer in FIG. 7A.
Figures 8A, 8B:
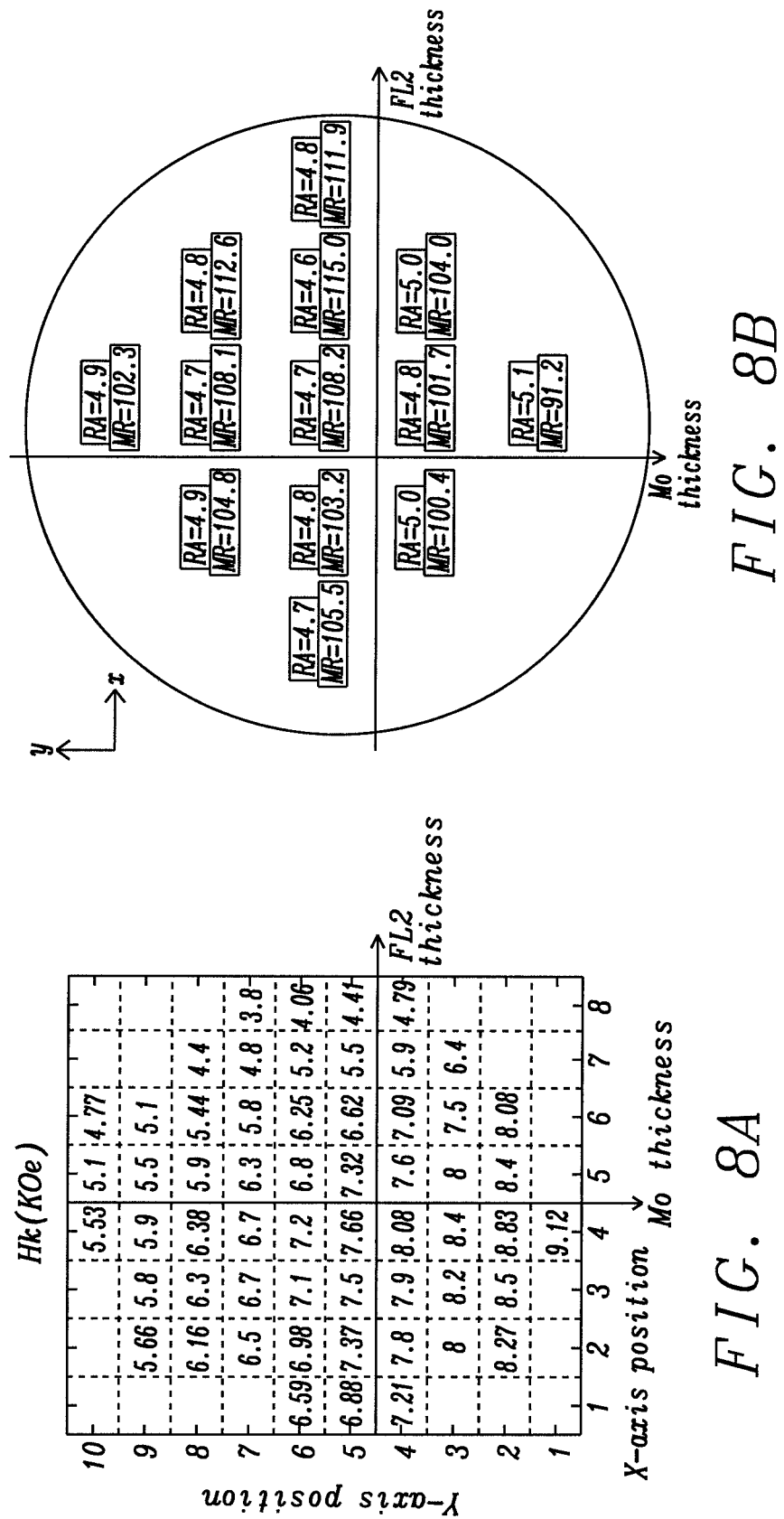
FIG. 8A is a plot of Hk for a STT-MRAM wafer having a plurality of p-MTJs with a FL1/MIS/FL2/improved Hk enhancing layer/NCL stack, and where FL2 thickness is varied in the x-axis direction, and the MIS layer is Mo with a thickness that is varied in the y-axis direction.
FIG. 8B is a view of a STT-MRAM wafer where RA product and MR for p-MTJs in FIG. 8A are plotted as a function of FL2 thickness and Mo MIS layer thickness.

FIGS. 7A-7D show magnetic performance for p-MTJ 1 where the MIS layer 41 is Ta, and FIGS. 8A-8D show comparative data for a MIS layer that is Mo to demonstrate the MIS composition may have a dramatic effect on Hk and DRR (MR), for example. FIG. 7A and FIG. 8A each show Hk as a function of x-axis and y-axis position on a STT-MRAM wafer where FL2 thickness t2 in FL2 42 (FIG. 1A) is increased from 4 Angstroms to 13 Angstroms in the positive x-axis direction, and where MIS thickness is increased from 1.3 Angstroms to 3.5 Angstroms in the negative y-axis direction. FL1 thickness is maintained at 7 Angstroms across the wafer. Clearly, FIG. 8A shows the Mo MIS layer has higher Hk at essentially all locations across the wafer. When comparing FIG. 7B with FIG. 8B, the Mo MIS layer enables the p-MTJ to achieve higher DRR than the Ta MIS layer while RA product is similar for the two different MIS layers.

Figure 8C:
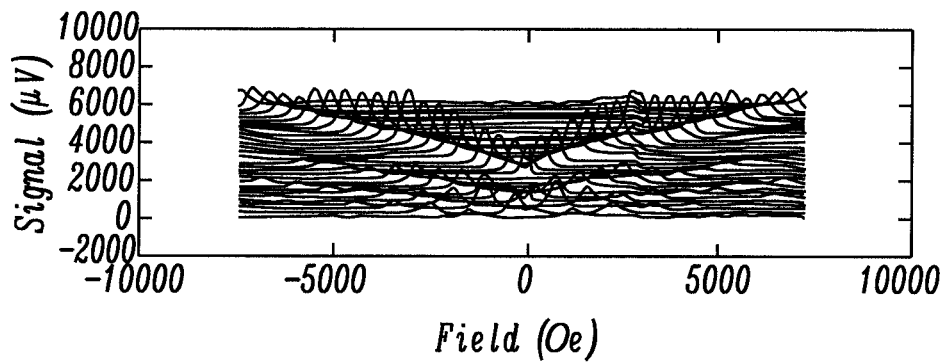
FIG. 8C is a graph showing FMR signals as a function of applied magnetic field (Hr) for the STT-MRAM wafer in FIG. 8A wherein the FMR signals are used to determine magnetic properties such as Hk.
Figure 8D:
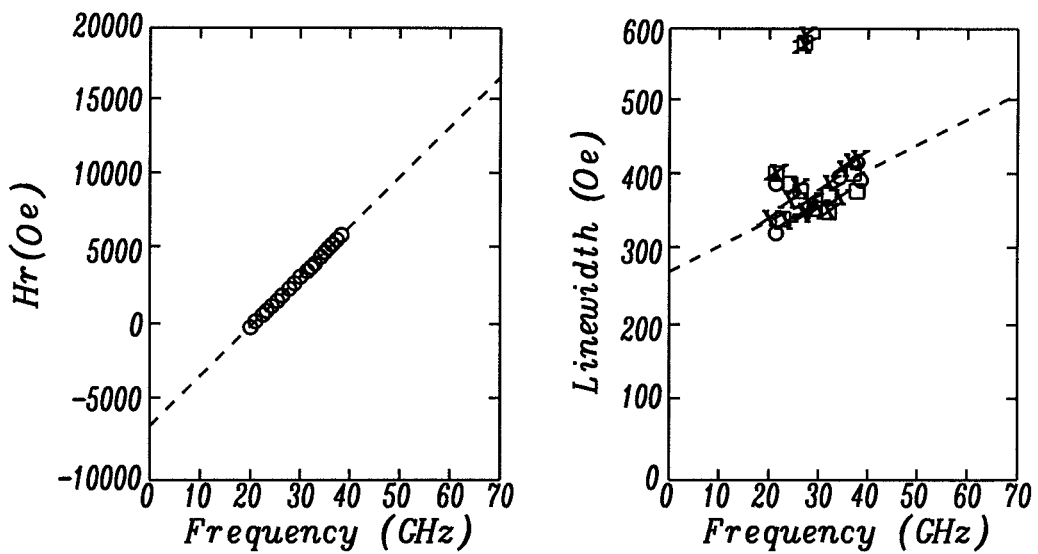
FIG. 8D is a graph showing the dependence of Hr and FMR linewidth on Mo and FL2 thicknesses for p-MTJs within the circled region on the wafer in FIG. 8A.

FIG. 7C and FIG. 8C show typical FMR measurement data with signal intensity plotted as a function of applied Hr field to generate results in FIGS. 7A-7B and FIGS. 8A-8B, respectively. FIG. 7D and FIG. 8D each show a plot of Hr vs. FMR input signal frequency, and a plot of Linewidth vs. FMR input signal frequency to generate results in FIGS. 7A-7B and FIGS. 8A-8B, respectively.

Referring to FIG. 9A, a plot of Hc vs. FL2 thickness is illustrated for a reference p-MTJ having an uppermost MCL (curve 70a), a p-MTJ 1 with a Hk enhancing layer/NCL stack that is Example A (curve 70b), p-MTJ 1 where the oxidation state in the Hk enhancing layer of Example A is reduced (lower oxygen content) to give Example B (curve 70d), and p-MTJ 1 where the oxidation state in the Hk enhancing layer of Example B is lowered to yield Example C (curve 70c). FL2 thickness varies from 4 Angstroms to 13 Angstroms and MIS thickness is a constant 2.4 Angstroms. Results within circle 90 show that Examples A-C exhibit significantly higher Hc/Jc ratio than the Reference when FL2 thickness is less than 10 Angstroms.

In FIG. 9B, a plot of Hc is shown as a function of MIS thickness that ranges from 1.3 Angstroms to 3.5 Angstroms and with a constant FL2 thickness of 8.5 Angstroms. Results for the Reference p-MTJ, Example A, Example B, and Example C are found in curves 71a, 71b, 71d, and 71c, respectively. At the high end of FL2 thickness (10-13 Angstroms) in FIG. 9A, and in the upper range of MIS thickness (FIG. 9B), Hc is about 2500-3000 Oe for all examples. However, in FIG. 9B, with a MIS thickness below about 2.5 Angstroms, there is a strong decrease in the Reference Hc to 1000 Oe or below while Examples A-C (within circle 91) maintain a Hc above 2000 Oe. This decrease in Hc for the Reference appears to be related to an increase in magnetic inhomogeneities at the FL/Hk enhancing layer interface that would lead to a large dispersion of Hk and/or Hc.

Referring to FIG. 10A, the performance of the Reference p-MTJ (curve 72a) and Examples A-C(curves 72b, 72d, 72c, respectively) are illustrated in terms of Jc as a function of FL2 thickness and MIS thickness, respectively. In this case, all p-MTJs show a steadily decreasing Jc as FL2 thickness is reduced from 13 Angstroms to 4 Angstroms while MIS thickness is a constant 2.4 Angstroms in FIG. 10A. In FIG. 10B, Jc is substantially independent of MIS thickness for the Reference (curve 73a), and for Examples A-C(curves 73b, 73d, 73c, respectively) although the Reference p-MTJ has a lower Jc at all values of MIS thickness when FL2 thickness is a constant 8.5 Angstroms in FIG. 10B. Thus, Jc shows a similar dependence on FL2 and MIS thickness for MCL (Reference) and NCL (Examples A-C) configurations. Since Hc may impact Jc, and in order to better estimate the STT switching efficiency of the aforementioned p-MTJs, we recognize the Hc/Jc ratio as a figure of merit (FOM) in determining p-MTJ performance. A Hk/Jc ratio could also be considered for a FOM. However, we find Hk to be more difficult to measure than Hc.

Figure 11A:
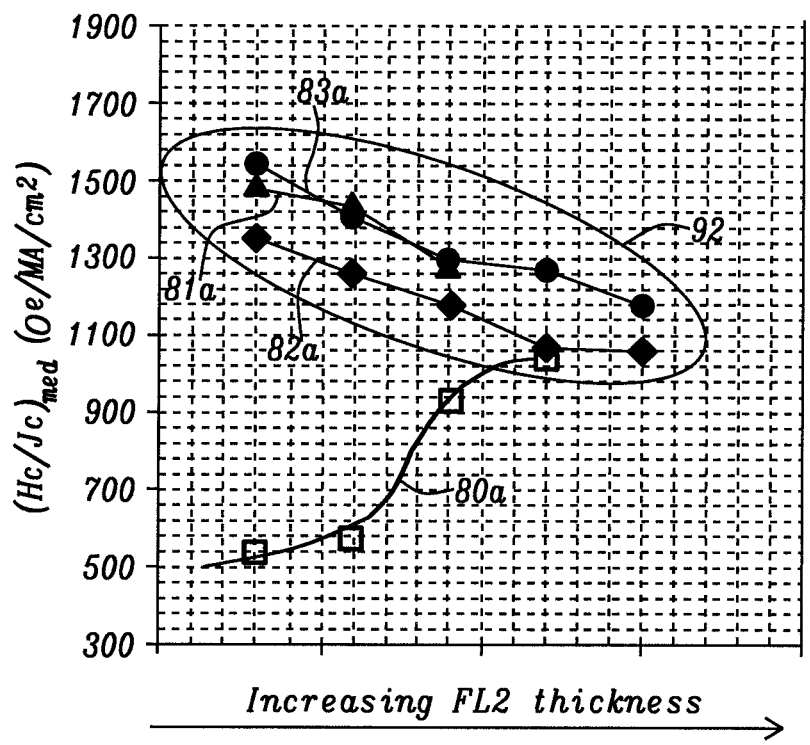
FIG. 11A is a plot of the Hc/Jc ratio vs. FL2 thickness for p-MTJs with a metal capping layer, and various NCLs according to an embodiment of the present disclosure.

Referring to FIG. 11A, the Hc/Jc ratio is plotted as a function of FL2 thickness. Data points on curve 80a correspond to the Reference p-MTJ that was used to generate curves 70a and 72a in FIG. 9A and FIG. 10A. Data points 81a, 82a, and 83a relate to Examples A, B, and C, respectively, that were used to generate curves 70b and 72b, 70d and 72d, and 70c and 72c, respectively, in FIG. 9A and FIG. 10A. Circled region 92 indicates that essentially all NCL configurations exhibit a higher Hc/Jc than the MCL configuration over the entire FL2 thickness range.

Figure 11B:
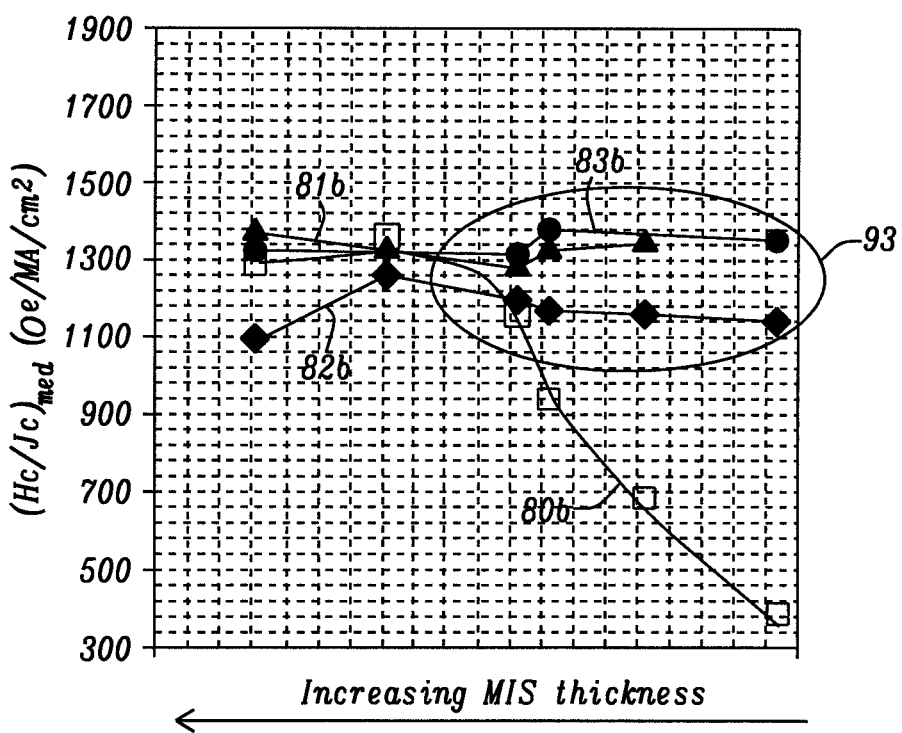
FIG. 11B is a plot of the Hc/Jc ratio vs. MIS thickness for p-MTJs with a metal capping layer, and various NCLs according to an embodiment of the present disclosure.

With regard to FIG. 11B, the Hc/Jc ratio is plotted as a function of MIS thickness. Data points on curve 80b correspond to the Reference p-MTJ that was used to generate curves 71a and 73a in FIG. 9B and FIG. 10B. Data points 81b, 82b, and 83b relate to Examples A, B, and C, respectively, that were used to generate curves 71b and 73b, 71d and 73d, and 71c and 73c, respectively, in FIG. 9B and FIG. 10B. The circled region 93 indicates that all NCL configurations exhibit a higher Hc/Jc than the MCL configuration when the MIS thickness is in the range of about 1.3 Angstroms to 2.4 Angstroms.

Figure 1B:
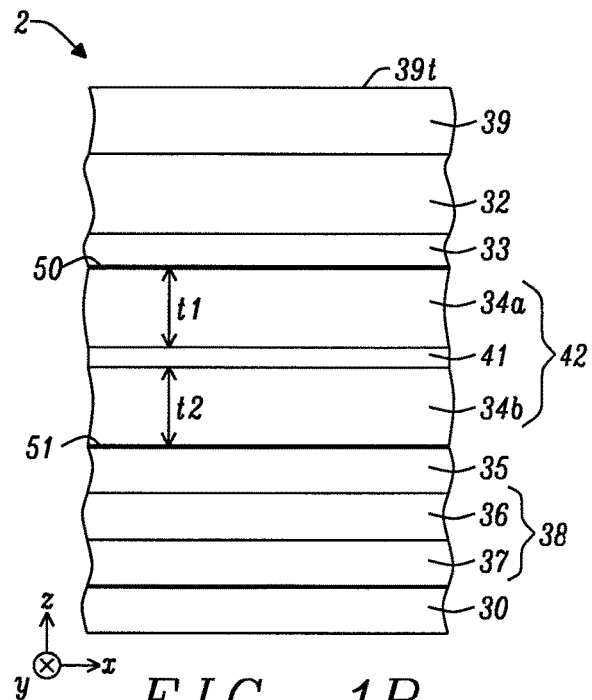

The first embodiment of the present disclosure also encompasses a p-MTJ 2 with a top spin valve structure as shown in FIG. 1B where NL 37, buffer layer 36, Hk enhancing layer 35, FL 42, tunnel barrier layer 33, pinned layer 32, and capping layer 39 are sequentially formed on substrate 30. The capping layer may be a MCL such as Ta/Ru, or a NCL described previously. Note that the positions of FL1 34a and FL2 34b are flipped compared with FIG. 1A so that FL1 maintains interface 50 with the tunnel barrier layer, and FL2 has interface 51 with the Hk enhancing layer. Here, the NL/buffer layer stack effectively serves as a seed layer. The buffer layer may be a single layer, or a multilayer such as L1/L2 described previously, except here L2 is the uppermost buffer layer while L1 is formed between L2 and the NL.

Figure 2A:
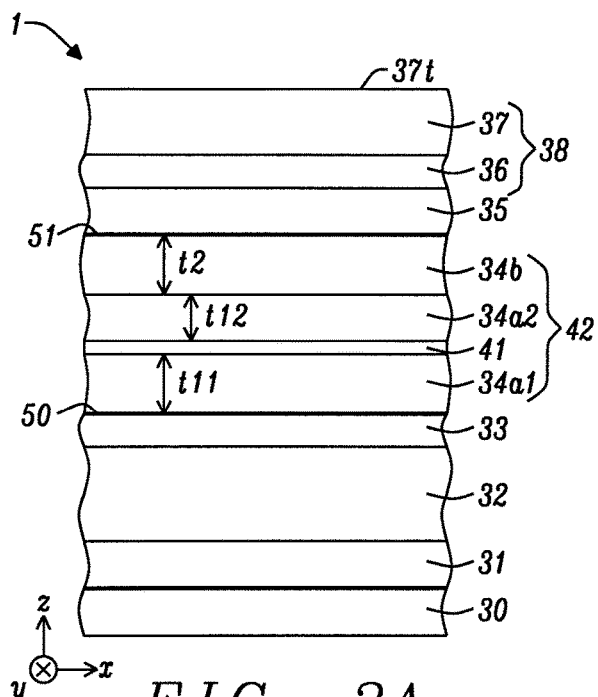
FIG. 2A and FIG. 2B are cross-sectional views showing a p-MTJ wherein a MIS layer is formed between a first FL1 sub-layer (FL1a) and a second FL1 sub-layer (FL1b) in bsv and tsv configurations, respectively, and FL1b contacts FL2 according to a second embodiment of the present disclosure.

According to a second embodiment shown in FIG. 2A, p-MTJ 1 retains all the layers and advantages of the first embodiment in FIG. 1A, except FL 42 is reconfigured such that the MIS layer 41 is formed within FL1, and between a first FL1 sub-layer 34a1 with thickness t11 and a second FL1 sub-layer 34a2 having thickness t12. Total FL thickness is (t11+t12+t2) and is preferably from 11 Angstroms to 25 Angstroms. FL2 34b is formed on a top surface of FL1 34a2. This embodiment may be especially beneficial when FL1 is a boron containing layer, and FL2 is a non-boron containing layer. Since the MIS layer is within FL1 rather than between FL1 and FL2, the MIS layer is expected to be a better boron sink. In some embodiments, the first and second FL1 sub-layers may have a different composition including different B content in CoFeB sub-layers, for example, in order to allow more flexibility in tuning FL magnetic properties and performance.

Figure 2B:
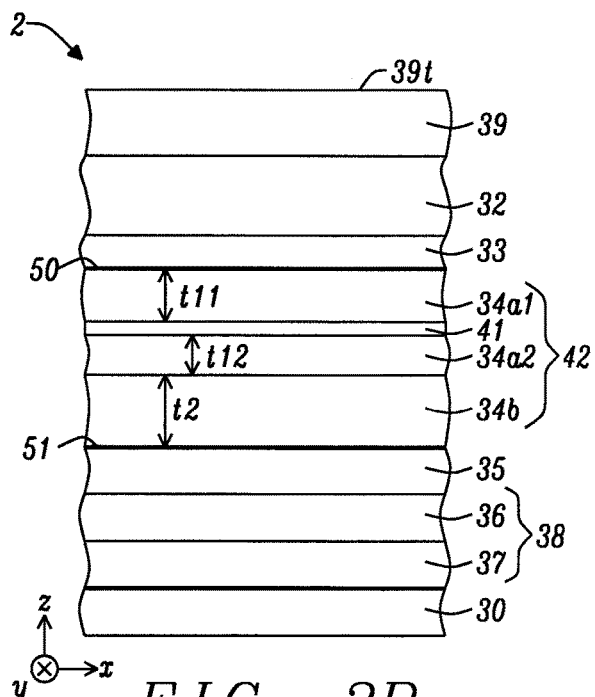

Referring to FIG. 2B, p-MTJ 2 retains all of the layers and stack order in FIG. 1B except FL 42 is modified to include MIS layer 41 within FL1 rather than between FL1 and FL2. Thus, the FL has a stack with FL2 34b, FL1 34a2, the MIS layer, and FL1 34a1 sequentially formed on Hk enhancing layer 35. Again, this FL configuration may employ the MIS layer as a more efficient boron sink in a boron containing FL1, and allow more flexibility in tuning FL properties than the first embodiment. For example, t11 may be greater than t12 so that the MIS layer is a sufficient distance from the tunnel barrier to avoid degrading DRR.

Figure 3A:
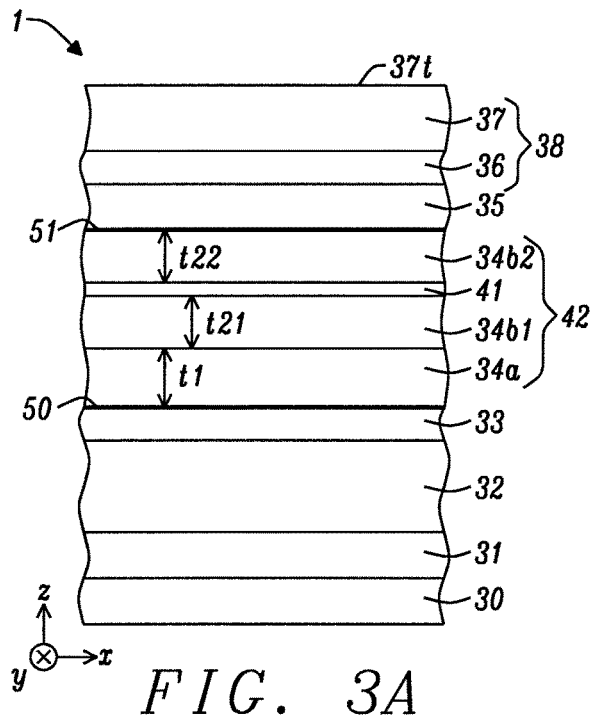
FIG. 3A and FIG. 3B are cross-sectional views showing a p-MTJ wherein a MIS layer is formed between first and second FL2 sub-layers (FL2a and FL2b) in bsv and tsv configurations, respectively, and where FL1 contacts FL2a according to a third embodiment of the present disclosure.

A third embodiment of the present disclosure is illustrated in FIG. 3A where p-MTJ 1 retains all the features of the first embodiment, except MIS layer 41 is formed within FL2 rather than between FL1 and FL2. Accordingly, FL 42 has a stack where FL1 34a, a first FL2 sub-layer 34b1 with thickness t21, the MIS layer, and a second FL2 sub-layer 34b2 with thickness t22 are sequentially formed on tunnel barrier 33. Preferably, total FL thickness (t1+t21+t22) is from 11 Angstroms to 25 Angstroms. FL2 34b1 and FL2 34b2 may have the same composition, or different compositions to enable more flexibility in FL performance.

Figure 3B:
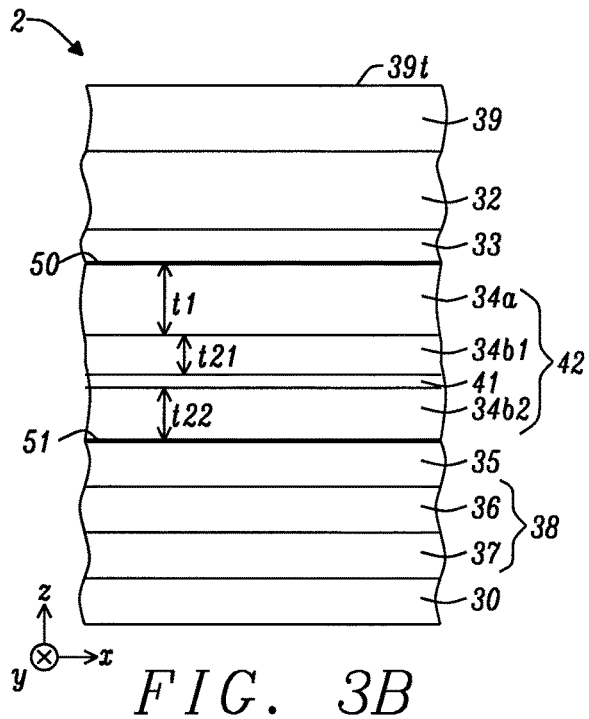

FIG. 3B depicts an alternative to the third embodiment where p-MTJ 2 retains all of the layers shown in FIG. 1B except MIS layer 41 is moved within FL2 to yield a FL stack where FL2 34b2, the MIS layer, FL2 34b1, and FL1 34a are sequentially formed on Hk enhancing layer 35. Similar to the second embodiment, the third embodiment provides more flexibility in FL performance by allowing each of the first and second FL2 sub-layers 34b1, 34b2, respectively, to have different compositions and different thickness to adjust the placement of the MIS layer within FL2. For example, t21 may be less than t22 to provide a sufficient distance between the MIS layer and the Hk enhancing layer to prevent inter-diffusion and alloying between the two.

Figure 4A:
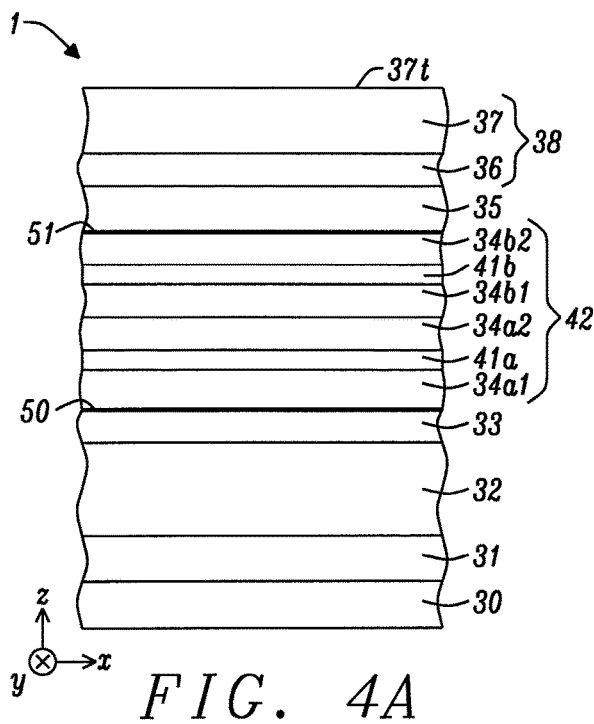
FIG. 4A and FIG. 4B are cross-sectional views showing a p-MTJ wherein a first MIS layer is formed between FL1a and FL1b sub-layers, and a second MIS layer is formed between FL2a and FL2b sub-layers in bsv and tsv configurations, respectively, according to a fourth embodiment of the present disclosure.

A fourth embodiment is depicted in FIG. 4A where p-MTJ 1 retains the same features as the second embodiment in FIG. 2A except a second MIS layer 41b is inserted into FL2. Accordingly, FL 42 now has a stack where FL1 sub-layer 34a1, first MIS layer 41a, FL1 sub-layer 34a2, FL2 sub-layer 34b1, the second MIS layer, and FL2 sub-layer 34b2 are sequentially formed on tunnel barrier 33. The fourth embodiment enables even more flexibility than the second and third embodiments in that the MIS layers may have different compositions and thicknesses to tune FL performance. For example, if FL1 is a boron containing layer and FL2 is non-boron containing, then MIS layer 41a may be a better boron sink than MIS layer 41b, while the second MIS layer is a better oxygen getter element than the first MIS layer. Furthermore, the FL1 sub-layers may have the same or different compositions, and the FL2 sub-layers may have the same or different compositions. Preferably, the sum of the first and second MIS layer thicknesses is between 0.5 Angstrom and 4 Angstroms.

Figure 4B:
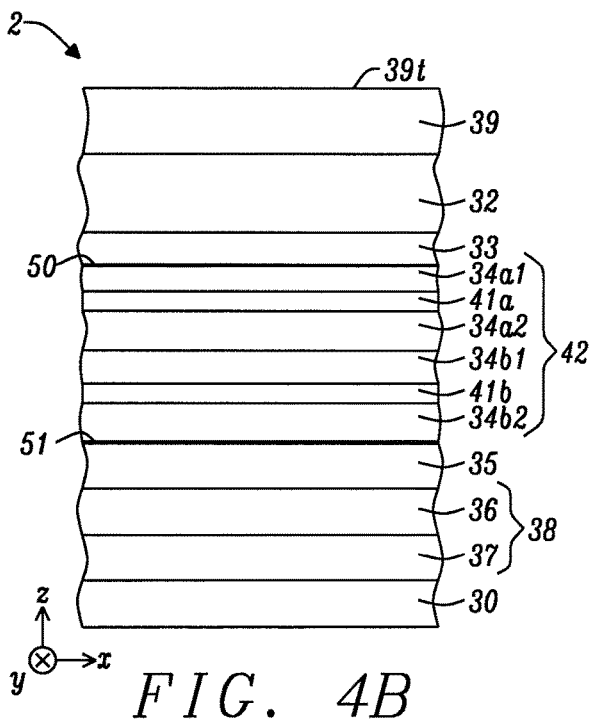

An alternative fourth embodiment is illustrated in FIG. 4B where p-MTJ 2 retains all of the layers of the second embodiment in FIG. 2B except a second MIS layer 41b is formed between FL2 sub-layer 34b1 and FL2 sub-layer 34b2 while a first MIS layer 41a is between FL1 sub-layer 34a1 and FL1 sub-layer 34a2. As in FIG. 4A, the second MIS layer enables more flexibility in designing FL performance.

In all embodiments described herein, the advantage of a higher Hc/Jc ratio for better FL switching is realized for spintronic applications including STT-MRAM than in the prior art. Furthermore, other p-MTJ properties such as RA, DRR, and thermal stability are maintained for an overall improvement in p-MTJ performance.

The present disclosure also encompasses a method of forming p-MTJ 1 on substrate 30. All layers in the embodiments illustrated herein may be formed in an Anelva C-7100 thin film sputtering system or the like which typically includes three physical vapor deposition (PVD) chambers each having five targets, an oxidation chamber, and a sputter etching chamber. Usually, the sputter deposition process comprises a noble gas such as argon, and oxygen is excluded unless required for tunnel barrier or Hk enhancing layer formation in the oxidation chamber.

Figure 12:
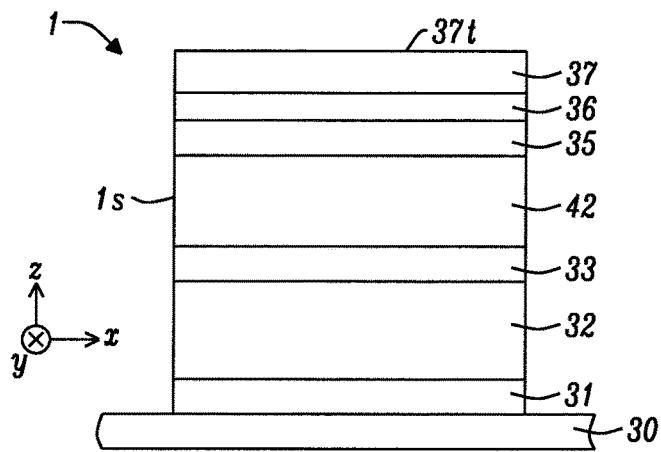
FIGS. 12-14 are cross-sectional views showing a sequence of steps that are used to form a plurality of p-MTJs according to an embodiment of the present disclosure.

Referring to FIG. 12, p-MTJ 1 is illustrated after a well known photolithography and etching sequence is followed to form sidewall 1s on the p-MTJ stack shown in FIG. 1A.

Figure 13:
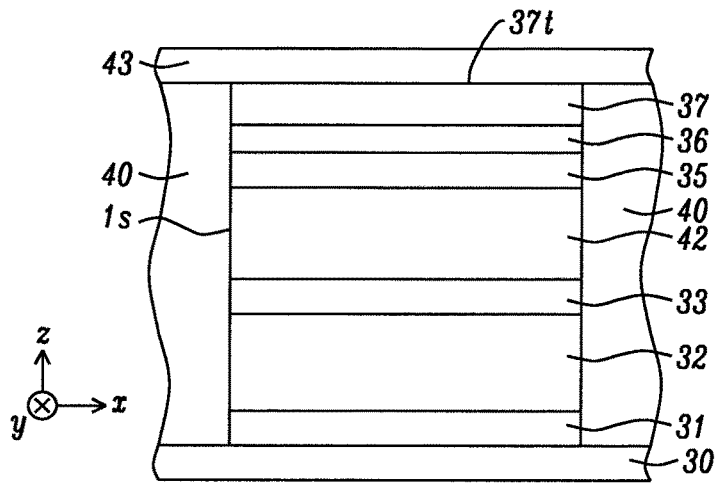

Thereafter, as depicted in FIG. 13, encapsulation layer 40 is deposited and electrically isolates the p-MTJ from adjacent p-MTJs (not shown) in an array formed as a result of the photolithography and etching sequence. A chemical mechanical polish (CMP) process is typically employed to form a smooth surface of the encapsulation layer 40 that becomes coplanar with a top surface of the p-MTJs in the array. Finally, a top electrode layer comprised of a plurality of parallel lines including top electrode 42 is formed on the encapsulation layer and on the p-MTJs.

Figure 14:
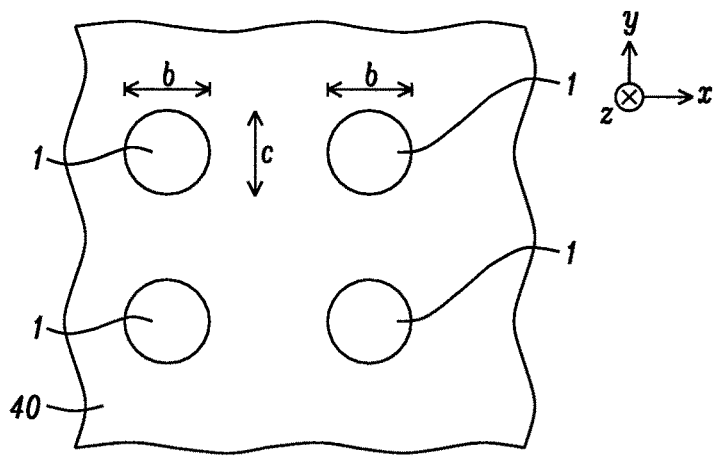

FIG. 14 is a top-down view with the top electrode layer removed and shows a plurality of p-MTJs 1 in an array of rows and columns and separated by encapsulation layer 40. In the exemplary embodiment, each p-MTJ has a circular shape having a width b and length c where b=c. In other embodiments (not shown), the p-MTJs may be in the shape of an oval or a polygon where b is unequal to c. It should be understood that p-MTJ 2 in the first through fourth embodiments may be substituted for p-MTJ 1 in the process sequence shown in FIGS. 12-14.

All of the embodiments described herein may be incorporated in a manufacturing scheme with standard tools and processes. A substantial improvement in the Hc/Jc ratio is achieved through a combination of metal insertion in the FL, a partially oxidized Hk enhancing layer, and a NCL with a buffer layer/NL configuration where the buffer layer prevents oxygen migration to the NL, and blocks nitrogen diffusion from the NL to the FL and Hk enhancing layer. The p-MTJ embodiments described herein are especially effective for a FL thickness from about 11 Angstroms to 25 Angstroms, and when the MIS thickness is in the range of 0.5 Angstrom to 4 Angstroms.

While the present disclosure has been particularly shown and described with reference to, the preferred embodiments thereof, it will be understood by those skilled in the art that various changes in form and details may be made without departing from the spirit and scope of this disclosure.

We claim:

1. A perpendicular magnetic tunnel junction (p-MTJ) structure, comprising:
   (a) a pinned layer (PL);
   (b) a tunnel barrier layer with a first surface that adjoins the PL, and a second surface that contacts a free layer (FL) and forms a first interface with the FL;
   (c) the FL that has a first metal insertion (MIS1) layer formed within one of a first FL sub-layer (FL1) and a second FL sub-layer (FL2), and wherein the FL has perpendicular magnetic anisotropy (PMA) as a result of the first interface, as a result of a second interface with a Hk enhancing layer;
   (d) the Hk enhancing layer having a non-stoichiometric oxidation condition, and that adjoins the FL to form the second interface on a side of the FL that is opposite to the first interface; and
   (e) a nitride capping layer (NCL), comprising:
      (1) a nitride layer (NL) that is a metal nitride or metal oxynitride; and
      (2) a buffer layer that is a single layer or multilayer that is one or more of Co, Fe, CoFe, and CoFeNi, or one or more of Mo, W, Ru, Nb, Ta, Cr, Pt, Cu, Au, Ag, Zn, V, Cd, Sn, Ir, Mn, and Rh that adjoins the NL and contacts the Hk enhancing layer on a side thereof that is opposite to the second interface, wherein the buffer layer prevents oxygen diffusion from the Hk enhancing layer to the NL, and blocks nitrogen diffusion from the NL to the FL.

2. The p-MTJ of claim 1 wherein the MIS1 layer is formed within FL1 to give a FL1a/MIS1/FL1b/FL2 configuration wherein FL1a is a first sub-layer of FL1, and FL1b is a second sub-layer of FL1.

3. The p-MTJ of claim 1 wherein the MIS1 layer is formed within FL2 to give a FL1/FL2a/MIS1/FL2b configuration wherein FL2a is a first sub-layer of FL2, and FL2b is a second sub-layer of FL2.

4. The p-MTJ of claim 2 further comprised of a second MIS (MIS2) layer that is formed within FL2 to give a FL1a/MIS1/FL1b/FL2a/MIS2/FL2b configuration wherein FL2a is a first sub-layer of FL2, and FL2b is a second sub-layer of FL2.

5. The p-MTJ of claim 4 wherein the MIS1 layer has a composition that is different from a composition of the MIS2 layer.

6. The p-MTJ of claim 1 wherein the MIS1 layer is a single layer or multilayer of one or more of Nb, Mo, Ta, W, Re, Ti, V, Cr, Zr, Hf, Ru, Rh, Os, Ir, Cu, Zn, Pt, Au, Ag, Pd, Al, B, Ga, Si, and Ge.

7. The p-MTJ of claim 1 wherein one or both of FL1 and FL2 is one or more of Co, Fe, CoFe, CoFeB, CoB, FeB, CoFeNi, and CoFeNiB.

8. The p-MTJ of claim 1 wherein one or both of FL1 and FL2 is comprised of a high Ku material having inherent PMA which is a Heusler alloy that is $Ni_2MnZ$, $Pd_2MnZ$, $Co_2MnZ$, $Fe_2MnZ$, $Co_2FeZ$, $Mn_3Ge$, or $Mn_2Ga$ where Z is one of Si, Ge, Al, Ga, In, Sn, and Sb, or an ordered $L1_0$ or $L1_1$ material with a composition that is one of MnAl, MnGa, or RT wherein R is Rh, Pd, Pt, Ir, or an alloy thereof, and T is Fe, Co, Ni, or an alloy thereof, or a rare-earth alloy with a TbFeCo, GdCoFe, FeNdB, or SmCo composition.

9. The p-MTJ of claim 1 wherein FL1 has a thickness t1, and FL2 has a thickness t2 where a sum of t1 and t2 is from 11 Angstroms to 25 Angstroms.

10. The p-MTJ of claim 1 wherein the Hk enhancing layer is a single layer or a laminate comprised of an oxide or oxynitride of one or more of Mg, Si, Sr, Ti, Ba, Ca, La, Al, Mn, V, and Hf, and has a resistance x area (RA) product less than a RA product of the tunnel barrier layer.

11. The p-MTJ of claim 1 further comprising a seed layer formed on a substrate to yield a seed layer/PL/tunnel barrier layer/FL/Hk enhancing layer/NCL stack in a bottom spin valve configuration.

12. The p-MTJ of claim 1 further comprising a seed layer formed on a substrate, and a capping layer (CL) on the PL to yield a seed layer/NCL/Hk enhancing layer/FL/tunnel barrier layer/PL/CL stack in a top spin valve configuration.

13. The p-MTJ of claim 1 wherein the p-MTJ is incorporated in a magnetic random access memory (MRAM), spin transfer torque (STT)-MRAM, spin orbit torque (SOT)-MRAM, spin torque oscillator, Spin Hall Effect device, magnetic sensor, or a biosensor.

14. The p-MTJ of claim 1 wherein the NL is comprised of a metal nitride (M1N) or metal oxynitride (M1ON) where M1 is one or more of Ti, V, Cr, Zr, Nb, Mo, Hf, Ta, W, and Si.

15. The p-MTJ of claim 1 wherein the NL has a M2M3N or M2M3ON composition where M2 is one of B, Al, Si, Ga, In, and Tl, and M3 is one or more of Pt, Au, Ag, Mg, Ca, Sr, Ba, Sc, Y, La, Co, Fe, Mn, Ru, Rh, Ir, Ni, Pd, Zn, Cu, Ti, V, Cr, Zr, Nb, Mo, Hf, Ta, and W such that the NL is a conductive alloy layer, or has M3 conductive channels formed in a M2N or M2ON insulating matrix.

16. The p-MTJ of claim 1 wherein the buffer layer is a single layer or multilayer that is one or more of Mo, W, Ru, Nb, Ta, Cr, Pt, Cu, Au, Ag, Zn, V, Cd, Sn, Ir, Mn, Rh, Co, Fe, CoFe, CoB, FeB, CoFeNi, and CoFeNiB.

17. The p-MTJ of claim 1 wherein the MIS1 layer is a continuous layer, a multilayer, a discontinuous layer, or is a plurality of metal particles, or metal clusters.

* * * * *